(12) United States Patent
Kiesel et al.

(10) Patent No.: US 11,719,559 B2
(45) Date of Patent: Aug. 8, 2023

(54) FIBER OPTIC SENSING SYSTEM FOR GRID-BASED ASSETS

(71) Applicant: Palo Alto Research Center Incorporated, Palo Alto, CA (US)

(72) Inventors: Peter Kiesel, Palo Alto, CA (US); Ajay Raghavan, Mountain View, CA (US); Todd Karin, Fairfield, CA (US); Qiushu Chen, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 806 days.

(21) Appl. No.: 16/665,015

(22) Filed: Oct. 28, 2019

(65) Prior Publication Data

US 2021/0123775 A1    Apr. 29, 2021

Related U.S. Application Data

(60) Provisional application No. 62/925,611, filed on Oct. 24, 2019.

(51) Int. Cl.
  *G01D 5/353* (2006.01)
  *G01K 11/32* (2021.01)
  (Continued)

(52) U.S. Cl.
  CPC ......... *G01D 5/35345* (2013.01); *G01K 11/32* (2013.01); *G01L 1/242* (2013.01); *G01R 31/62* (2020.01)

(58) Field of Classification Search
  None
  See application file for complete search history.

(56) References Cited

U.S. PATENT DOCUMENTS

| 5,499,313 A | 3/1996 | Kleinerman |
| 6,476,377 B1 | 11/2002 | Hodge |
| (Continued) | | |

FOREIGN PATENT DOCUMENTS

| BR | 202016024652 | 5/2018 |
| BR | 102018067921 | 3/2020 |
| (Continued) | | |

OTHER PUBLICATIONS

Extended European Search Report from EP Application No. 20199481.1 dated Feb. 22, 2021, 9 pages.

(Continued)

*Primary Examiner* — Patrick Assouad
*Assistant Examiner* — Haidong Zhang
(74) *Attorney, Agent, or Firm* — Mueting Raasch Group

(57) ABSTRACT

A sensor system includes a sensor network comprising at least one optical fiber having one or more optical sensors. At least one of the optical sensors is arranged to sense vibration of an electrical device and to produce a time variation in light output in response to the vibration. A detector generates an electrical time domain signal in response to the time variation in light output. An analyzer acquires a snapshot frequency component signal which comprises one or more time varying signals of frequency components of the time domain signal over a data acquisition time period. The analyzer detects a condition of the electrical device based on the snapshot frequency component signal.

14 Claims, 27 Drawing Sheets

(51) Int. Cl.
  *G01R 31/62* (2020.01)
  *G01L 1/24* (2006.01)

(56) References Cited

U.S. PATENT DOCUMENTS

| | | | |
|---|---|---|---|
| 7,845,404 | B2 | 12/2010 | McStay et al. |
| 8,700,358 | B1 | 4/2014 | Parker, Jr. |
| 9,228,890 | B2 | 1/2016 | Omichi et al. |
| 9,664,609 | B2 | 5/2017 | Magne et al. |
| 2003/0118297 | A1 | 6/2003 | Dunphy et al. |
| 2006/0018586 | A1 | 1/2006 | Kishida |
| 2006/0151191 | A1 | 7/2006 | Hosokawa et al. |
| 2007/0171958 | A1 | 7/2007 | Hoang et al. |
| 2008/0219617 | A1 | 9/2008 | Kuang |
| 2009/0074348 | A1 | 3/2009 | Xia et al. |
| 2014/0061452 | A1 | 3/2014 | Shade |
| 2014/0091781 | A1 | 4/2014 | Cova et al. |
| 2014/0092375 | A1 | 4/2014 | Raghavan et al. |
| 2014/0321799 | A1 | 10/2014 | Udd |
| 2015/0280290 | A1* | 10/2015 | Saha .......... H01M 10/425 324/426 |
| 2016/0003782 | A1 | 1/2016 | Von Herzen et al. |
| 2016/0018319 | A1 | 1/2016 | Hegyi et al. |
| 2016/0040527 | A1 | 2/2016 | Balagopal |
| 2017/0033414 | A1* | 2/2017 | Ganguli .......... G01R 31/392 |
| 2017/0356870 | A1 | 12/2017 | Doany et al. |
| 2017/0363805 | A1 | 12/2017 | Iwakawa |
| 2018/0128673 | A1 | 5/2018 | Oshetski |
| 2018/0149528 | A1 | 5/2018 | Hull |
| 2019/0011491 | A1 | 1/2019 | Raghavan et al. |
| 2019/0317130 | A1 | 10/2019 | Sun et al. |
| 2021/0095738 | A1* | 4/2021 | Evans .......... F16F 1/028 |

FOREIGN PATENT DOCUMENTS

| | | |
|---|---|---|
| CN | 101639386 | 12/2011 |
| CN | 203573776 | 4/2014 |
| CN | 203772406 | 8/2014 |
| CN | 104296859 | 1/2015 |
| CN | 104808125 | 7/2015 |
| CN | 204855019 | 8/2015 |
| CN | 204855019 | 12/2015 |
| CN | 105510631 | 4/2016 |
| CN | 105547418 | 5/2016 |
| CN | 105547465 | 5/2016 |
| CN | 105806467 | 7/2016 |
| CN | 106500822 | 3/2017 |
| CN | 206002196 | 3/2017 |
| CN | 106646096 | 5/2017 |
| CN | 206177487 | 5/2017 |
| CN | 107421570 | 12/2017 |
| EP | 0646304 B1 | 5/1999 |
| EP | 2928006 | 10/2015 |
| EP | 2975366 A1 | 1/2016 |
| EP | 3425361 | 1/2019 |
| JP | 2001183257 A * | 7/2001 |
| WO | 9608695 | 3/1996 |
| WO | 2005091791 | 10/2005 |
| WO | 2005/114099 | 12/2005 |
| WO | 2016/022245 | 2/2016 |
| WO | WO 2016168621 A1 | 10/2016 |
| WO | 2016/183677 | 11/2016 |
| WO | 2019/015426 | 1/2019 |

OTHER PUBLICATIONS

Extended European Search Report from EP Application No. 20201648.1 dated Jul. 12, 2021, 14 pages.
Amin et al., "Toward a smart grid: power delivery for the 21st century," IEEE power and energy magazine, 3(5), pp. 34-41, 2005.
Bellmann et al., "Compact and fast read-out for wavelength-encoded biosensors," in MOEMS-MEMS. International Society for Optics and Photonics, 7593: 759302, 2010.
Berger, "Dielectric strength of insulating materials," Carbon, 1, p. 2, 2006.
Chen et al., "Analysis of voltage profile problems due to the penetration of distributed generation in low-voltage secondary distribution networks," IEEE Transactions on Power Delivery, 27(4), pp. 2020-2028, 2012.
Cohen et al., "Economic Effects of Distributed PV Generation on California's Distribution System," Energy Institute at Hass Working Paper-260, 2015.
Donohue et al., "Long Island City Network Jul. 17-25, 2006," Incident Investigation Committee Report, Consolidated Edison Co. of New York, 2007.
Emsley et al. "Review of Chemical Indicators of Degradation of Cellulosic Electrical Paper Insulation in Oil-filled Transformers", IEEE Proc. Sci. Measur. Techn., vol. 141, pp. 324_334, 1994.
EUROPIC (European Manufacturing Platform For Photonic Integrated Circuits) project final report, online at http://cordis.europa.eu/result/rcn/55864_en.html, 2013.
Godina et al., "Effect of loads and other key factors on oil-transformer ageing: sustainability benefits and challenges," Energies, 8(10), pp. 12147-12186, 2015.
Gungor et al., "Opportunities and challenges of wireless sensor networks in smart grid," IEEE Transactions on Industrial Electronics, 57(10), pp. 3557-3564, 2010.
Gungor et al., "A survey on communication networks for electric system automation," Comput. Netw., vol. 50, No. 7, pp. 877-897, May 2006.
Hilshey et al., "Estimating the impact of electric vehicle smart charging on distribution transformer aging," IEEE Transactions on Smart Grid, 4(2), pp. 905-913, 2013.
Hoffman et al., "The No-U-turn sampler: adaptively setting path lengths in Hamiltonian Monte Carlo." Journal of Machine Learning Research 15.1, 2014, pp. 1593-1623.
Huang et al., "State estimation in electric powergrids: Meeting new challenges presented by the requirements of the future grid," IEEE Signal Processing Magazine, 29(5), pp. 33-43, 2012.
Kai et al., "Analysis and research of Grounding Modes of Optical Fiber Ground Composite Wire [J]," High Voltage Engineering, 9, p. 020, 2008.
Kazerooni et al., "Optimal load management of EV battery charging and optimization of harmonic impacts on distribution transformers," In Electrical & Computer Engineering (CCECE), 2012 25th IEEE Canadian Conference on (pp. 1-4). IEEE, Apr. 2012.
Klonari et al., "Estimating the Photovoltaic Hosting Capacity of a Low Voltage Feeder Using Smart Meters' Measurements," Smart Meters Architecture and Applications, 2016.
Li et al., "Recent applications of fiber optic sensors to health monitoring in civil engineering," Engineering structures, 26(11), pp. 1647-1657, 2004.
Lisowska-Lis, "Thermographic monitoring of the power transformers." Measurement Automation Monitoring 63, 2017.
Liu et al., "Homogenized Magnetoelastic Behavior Model for the Computation of Strain Due to Magnetostriction in Transformers," IEEE Transactions on Magnetics, 52(2), pp. 1-12, 2016.
Lundgaard, "Partial discharge-part XIII: Acoustic partial discharge detection—Fundamental Considerations", IEEE Electr. Insul. Mag., 8, 25-31, 1992.
Martinez et al., "Direct writing of fibre Bragg gratings by femtosecond laser," Electronics Letters, 40(19), p. 1, 2004.
McDonald et al., "Distribution Systems, Substations, and Integration of Distributed Generation", Encyclopedia of Sustainability Science and Technology, 63 pages, 2013.
McGinn et al. "Reducing conventional copper signaling in high voltage substations with IEC 61850 process bus system," In PowerTech, 2009 IEEE Bucharest (pp. 1-8). IEEE, Jun. 2009.
McGranaghan et al., "Technical and system requirements for advanced distribution automation," In 18th International Conference and Exhibition on Electricity Distribution (vol. 5, p. 93), Jun. 2005.
Merzbacher et al., "Fiber optic sensors in concrete structures: a review," Smart Materials and Structures, 5(2), p. 196, 1996.
Minhas et al, "Using fault augmented modelica models for diagnostics", In Proceedings of the 10th International Modelica Con-

(56) References Cited

OTHER PUBLICATIONS ference; Mar. 10-12, 2014; Lund; Sweden (No. 96, pp. 437-445). Linköping University Electronic Press.

Nellen et al. "Reliability of fiber Bragg grating based sensors for downhole applications," Sensors and Actuators A: Physical, 103(3), pp. 364-376, 2003.

Palen, "Surface mount optical interconnects," Integrated Optoelectronic Devices, pp. 68990B-68990B, International Society for Optics and Photonics, 2008.

Pezeshski et al. "Impact of high PV penetration on distribution transformer insulation life," IEEE Transactions on Power Delivery. 29(3), pp. 1212-1220, 2014.

Posada-Roman et al., "Fiber optic sensor for acoustic detection of partial discharges in oil-paper insulated electrical systems," Sensors, 12(4), pp. 4793-4802, 2012.

Ribeiro et al., "Multipoint fiber-optic hot-spot sensing network integrated into high power transformer for continuous monitoring," IEEE Sensors Journal, 8(7), pp. 1264-1267, 2008.

Rivera et al., "Measurements of mechanical vibrations at magnetic cores of power transformers with fiber-optic interferometric intrinsic sensor," IEEE Journal of Selected Topics in Quantum Electronics, 6(5), pp. 788-797, 2000.

Saha et al., "Uncertainty management for diagnostics and prognostics of batteries using Bayesian techniques", Proc. IEEE Aerospace Conference, pp. 1-8, 2008.

Schuh et al., "High-resolution, high-frequency wavelength shift detection of optical signals with low-cost, compact readouts," In SPIE Sensing Technology+Applications (pp. 94800B-94800B), Jun. 2015.

Shmilovitz et al., "Characteristics of modern nonlinear loads and their influence on systems with distributed generation," International journal of Energy Technology and Policy, 5(2), pp. 219-240, 2007.

Sommer et al., "Fast and slow ion diffusion processes in lithium ion pouch cells during cycling observed with fiber optic strain sensors," Journal of Power Sources, 296, pp. 46-52, 2015.

Sommer et al., "Monitoring of Intercalation Stages in Lithium-Ion Cells over Charge-Discharge Cycles with Fiber Optic Sensors," Journal of The Electrochemical Society, 162(14), pp. A2664-A2669, 2015.

Stone, "Partial discharge diagnostics and electrical equipment insulation condition assessment," IEEE Trans. Dielectr. Electr. Insul., 12, 891-903, 2005.

Teunissen et al., "Stability of fiber Bragg grating sensors for integration into high-voltage transformers for online monitoring," In Optical Fiber Sensors Conference Technical Digest, 2002. Ofs 2002, 15th (pp. 541-544). IEEE, May 2002.

Udd et al. "Fiber optic distributed sensing systems for harsh aerospace environments," Proc. SPIE (3674-136), 1999.

U.S. Department of Energy, "Report on the First Quadrennial Technology Review," United States Department of Energy, Washington, DC (2011).

U.S. Department of Energy, "Assessment study on sensors and automation in the industries of the future," Office of Energy and Renewable Energy Rep., 2004.

Wang et al, "Cyber security in the Smart Grid: Survey and challenges," Computer Networks, 57(5), pp. 1344-1371, 2013.

Yang et al., "A survey on technologies for implementing sensor networks for power delivery systems," in Proc. IEEE Power Eng. Soc. Gen. Meeting, pp. 1-8, Jun. 2007.

Yang-Divan et al., "Power line sensornet—A new concept for power grid monitoring," in Proc. IEEE Power Eng. Soc. Gen. Meeting, pp. 1-8. Jun. 2006.

Yu et al., "Fiber Fabry-Perot sensors for detection of partial discharges in power transformers," Applied Optics, 42(16), pp. 3241-3250, 2003.

Zhang et al., "Dynamic deformation analysis of power transformer windings in short-circuit fault by FEM," IEEE Transactions on Applied Superconductivity, 24(3), pp. 1-4, 2014.

Pandey et al., "Damage Detection from Changes in Curvature Mode Shapes," 1991, *Journal of Sound and Vibration*, 145(2):321-32.

* cited by examiner

FIBER OPTIC SENSING SYSTEM FOR GRID-BASED ASSETS

RELATED PATENT DOCUMENTS

This application claims the benefit of U.S. provisional patent application Ser. No. 62/925,611, filed on Oct. 24, 2019, to which priority is claimed pursuant to 35 U.S.C. § 119(e), and which is incorporated herein by reference in its entirety.

RESEARCH AND DEVELOPMENT

This invention is based on work supported by the U.S. Department of Energy (DOE)/Office of Electricity through the DOE National Energy Technology Laboratory under award agreement #DE-OE0000872. The Government has certain rights to this invention.

BACKGROUND

Electrical device assets, such as transformer and voltage regulators, are important components in conditioning and delivering power from the electrical grid. It is useful to monitor the performance and health of these electrical device assets in order to predict end of life and/or to schedule maintenance. Fiber optic sensors operate in harsh environments, are not affected by electrical noise, and are well suited to monitor the internal and external parameters of grid-connected electrical assets.

BRIEF SUMMARY

Some embodiments are directed to a sensor system. The sensor system includes a sensor network comprising at least one optical fiber having one or more optical sensors that are arranged to sense vibration of an electrical device and to produce a time variation in light output in response to the vibration. A detector generates an electrical time domain signal in response to the time variation in light output of at least one optical sensor of the sensor network. An analyzer acquires a snapshot frequency component signal. Each snapshot frequency component signal comprises one or more time varying signals of frequency components of the time domain signal over a data acquisition time period. The analyzer detects a condition of the electrical device based on the snapshot frequency component signal.

Some embodiments involve a method that includes optically sensing vibrations of an electrical device using at least one optical sensor and producing a time variation in light output from the optical sensor in response to the vibration. A time domain signal representing the time variation light output of the at least one optical sensor is generated. At least one snapshot frequency component signal is acquired that comprises time varying frequency components of the time domain signal over a data acquisition time period. A condition of the electrical device is detected based on the snapshot frequency component signal.

In accordance with some embodiments a sensor system includes a sensor network comprising at least one optical fiber having one or more optical sensors. The optical sensors are arranged to sense one or more parameters of an electrical device. At least one detector generates an electrical time domain signal in response to a time variation in light output of at least one optical sensor of the sensor network. An analyzer identifies changes in a first parameter of the electrical device based on analysis of the time domain signal of the optical sensor over a first data acquisition period and identifies changes in a second parameter of the electrical device based on analysis of the time domain signal of the optical sensor over a second data acquisition period that is shorter than the first data acquisition period.

Some embodiments are directed to a sensor system that includes a sensor network comprising at least one optical fiber that includes at least one optical sensor arranged to sense vibration of an electrical device and to produce a time variation in light output from the optical sensor in response to the vibration. A detector generates an electrical time domain signal in response to the time variation in light output. An analyzer identify eigenfrequencies of the electrical device represented in the time domain signal and detects a condition of the electrical device based on a change in the eigenfrequencies.

A method includes optically sensing vibration of an electrical device using at least one optical sensor. A time domain representing a time variation in light output of the at least one optical sensor in response to the vibration is generated. Eigenfrequencies of the electrical device represented in the time domain signal are identified and are used to detect a condition of the electrical device.

According to some embodiments a sensor system includes a sensor network of at least one optical fiber comprising one or more optical sensors. The one or more optical sensors includes at least one vibration sensor disposed within a power grid electrical device. The vibration sensor sense vibration of the power grid electrical device and produces a time variation in light output from the sensor in response to the vibration. A detector generates an electrical time domain signal in response to the time variation in light output from the vibration sensor. An analyzer is configured to acquire at least one snapshot frequency component signal comprising time varying frequency components of the time domain signal over a data acquisition time period. The analyzer detects a condition of the power grid electrical device based on the snapshot frequency component signal.

Some embodiments are directed to a sensing method. Vibrations of a power grid electrical device are sensed using at least one optical sensor. The optical sensor produces a time variation in light output from the optical sensor in response to the vibration. An electrical time domain signal representing the time variation in light output from the at least one optical sensor is generated. One or more eigenfrequencies of the power grid electrical device represented in the time domain signal are identified and a condition of the power grid electrical device is detected based on the eigenfrequencies.

A sensor system comprises a sensor network having at least one optical fiber that includes one or more optical sensors including at least one vibration sensor disposed within a power grid electrical device. The vibration sensor senses vibration of the power grid electrical device and produces a time variation in light output from the sensor in response to the vibration. A detector generate an electrical time domain signal in response to the time variation in light output from the vibration sensor. An analyzer acquires at least one snapshot frequency component signal comprising time varying frequency components of the time domain signal over a data acquisition time period. The analyzer detects a condition of the power grid electrical device based on the snapshot frequency component signal.

According to some embodiments a system includes a sensing rod configured to be inserted through a case of a power grid electrical device. The sensing rod comprises a support rod and at least one optical fiber disposed in or on the support rod. The optical fiber includes multiple optical sensors.

An oil-filled electrical device comprises a case configured to contain oil. Insulation material including one or more oil ducts is disposed within the case. At least one optical fiber extends through at least one of the oil ducts.

In accordance with some embodiments, a sensor system comprises a sensor network comprising at least one optical fiber. The optical fiber that includes one or more optical vibration sensors that are arranged to sense vibration of a power grid electrical device, each vibration sensor produces a time variation in light output in response to the vibration. A detector generates an electrical time domain signal in response to the time variation in light output of at least one optical sensor of the sensor network. An analyzer identifies eigenfrequencies of the electrical device represented in the time domain signal and detects a condition of the power grid electrical device based on the eigenfrequencies.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Figure 1:
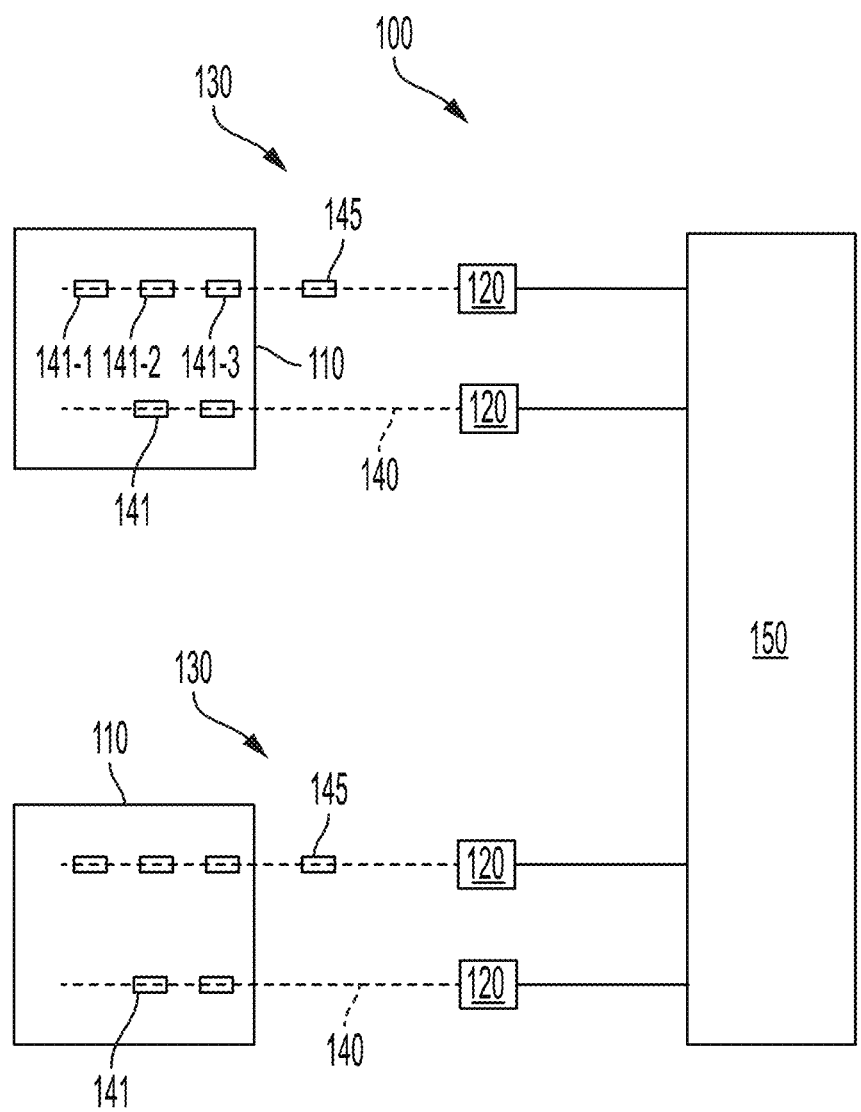
FIG. 1 is a block diagram of a system 100 configured to monitor electrical device assets using optical sensors in accordance with some embodiments.

Monitoring internal and/or external vibration of electrical devices such as power distribution assets including transformers and voltage regulators can allow for detecting the condition of the device. Determining changes in the condition of the electrical device over time can facilitate estimating health, predicting remaining useful life, and/or scheduling maintenance for the electrical device. Embodiments described herein are directed to systems and methods for determining the condition of electrical devices based on a time period snapshot of frequency components of vibration signals obtained using optical sensors disposed within the electrical device.

In some embodiments, the electrical device is a power grid component such as a power grid network transformer or power grid voltage regulator. In some implementations, the electrical device may be an oil-filled device. Oil-filled transformers, voltage regulators and other such devices are used at many locations across the electrical grid. Oil is used within these devices both for its high dielectric strength, allowing for a more compact form factor, and for its heat transfer and dissipation ability. Heat transfer to the external oil tank wall of an oil-filled device is generally needed to keep the working electrical components of the device at a lower temperature. The heat generated by the components is transferred into the surrounding oil and then to the tank wall either by direct heat conduction through the oil to the tank wall and/or by heat convection between the circulated oil and the tank wall. The heat can then be dissipated into the external environment through a highly emissive radiator surface. Radiator elements thermally coupled to the tank walls can be used to increase the heat transfer rate from the tank to the environment. The convection of oil inside the transformer tank as well as the oil-fill level has an impact on the vibration spectrum of the mechanical structure of the electrical device.

In some embodiments, there may be multiple vibration sensors, e.g., ranging from a few sensors to a few hundred sensors, for example, disposed within the device and/or mounted to different components of the electrical device. Monitoring vibrations at different locations can provide information on mechanical impacts that occur during transport, installation, maintenance, and/or normal operation. The mechanical structure of the electrical device has defined eigenfrequencies that can be excited by impacts (external or internal) that may change over time and/or as the structure ages. Monitoring vibration and/or temperature within the device may allow for early detection of hot spots, subtle leaks and/or other component degradation, such as insulation paper aging, coil metal creep, and/or situations where oil inside the device is affected by dirt, deposits, corrosion and/or changes in oil viscosity due to contamination and/or aging. External impacts can include a vehicle such as a car, truck or train passing by the electrical device, impact during transport, installation or maintenance of the electrical device, impacts from falling objects and impacts from other sources. The vibration signals may be relatively low frequency vibration signals, e.g., <50 Hz or may have frequencies in the range of acoustic emission signals (e.g., 50-200 KHz).

In various embodiments, the optical sensor network can facilitate detection of vibrations driven by the AC nature of the electrical system, mechanical eigenfrequencies of the electrical device, temperature inside the device, and/or oil level within the device among other possible conditions. The sensor network that can include a few or many sensors provide scalability of the detection system. Optical sensing allows for multiple variables such as vibration, temperature, oil level, etc to be measured at the same coordinates and time, (x, y, z, t). The system provides high spatial and temporal resolution which is suitable in harsh environment and significantly immune to electromagnetic interference (EMI). Thus, the approaches described herein enable accurate physical model and condition identification. Conditions that may be sensed include internal events including operational events (such as load condition change or heat ventilation condition) maintenance event (such as degradation), and external events (such as external impacts).

Optical sensing is particularly useful when the sensors are disposed in harsh environments, such as within an oil-filled electrical device, and/or in locations in which electromagnetic interference (EMI) is significant.

FIG. 1 is a block diagram of a system 100 configured to monitor electrical device assets using optical sensors in accordance with some embodiments. The system 100 includes a sensor network 130 comprising at least one optical fiber 140 that includes one or more internal optical sensors 141 disposed within the electrical device 110. The sensor network may optionally include one or more external optical sensors 145 disposed outside the electrical device 110. At least some of the sensors 141, 145 are configured to sense vibration. The external sensors may sense vibration, humidity, gases, temperature and/or other environmental parameters, for example.

Vibration of the electrical device 110 causes a variation in the light output from at least one of the optical sensors 141. The system 100 includes a detector 120 comprising at least one photosensitive device capable of transducing the light signal to an electrical signal. The detector 120 generates a time domain electrical vibration signal in response to the light output of the optical sensor 141. An analyzer 150 acquires a snapshot frequency component signal that includes one or more time varying frequency components of the time domain signal respectively over one or more data acquisition time periods. The snapshot frequency component signal is a group of time varying signals representing frequency components of the time domain signal. For example, the snapshot frequency component signal may include the time varying 20 Hz frequency component of the time domain signal, the time varying 60 Hz frequency component of the time domain signal, and the time varying 120 Hz frequency component of the time domain signal, etc. For an example of a snapshot frequency component signal see FIG. 6E which includes 20 Hz, 60 Hz, 120 Hz, 180 Hz, and 300 Hz component signals.

The time varying frequency components may be acquired over multiple data acquisition time periods, e.g., intervals of 10 seconds and 1 minute. To determine the frequency response of very short events, like energizing the transformer or mechanical impact from outside, even shorter time intervals of 1 second or shorter may be needed. The higher harmonics in the vibration signals may be typically short and have different phases. Thus, frequency components acquired over different data acquisition time periods may be helpful because strong higher harmonic signals can cancel themselves out if integrated over a longer data acquisition time period (e.g., 1 minute time period). The analyzer may detect a condition of the electrical device based on the snapshot frequency component signal. In some embodiments, the analyzer may develop a trend of one or more features of the snapshot frequency component signal, such as amplitudes, ratios of amplitudes, rise time, fall, time, etc of the frequency components.

To extract the frequency components of the time domain signal, the analyzer 150 can perform a time domain to frequency domain transformation of the vibration signal obtained from the detector 120. For example, the analyzer 150 may transform the time domain vibration signal to a frequency domain signal by using a wavelet transformation or a Fourier transformation.

According to some embodiments, analyzer 150 includes a memory that stores a library of standards corresponding to different conditions of the electrical device. The analyzer may compare the snapshot frequency component signal to the standard and determines if the condition exists based on the comparison. For example, the analyzer may compare one or more of the time varying frequency components of the snapshot frequency components signal to the standard. A standard may comprise a template of time varying frequency components that are expected to be present over the data acquisition period if the condition occurs, for example. A standard may include the amplitudes of frequency components, amplitude averages, amplitude ratios and/or other calculated values over data acquisition period that are expected for a particular condition of the electrical device. The frequency components can be attributed to the transformer operation itself, e.g., 60 Hz and higher harmonics, as well as other structural/mechanical/electro-mechanical eigenfrequencies from the transformer tank and components stimulated by the transformer operation or mechanical impact from outside. The standard may comprise morphological features of the frequency component signal over the data acquisition time. Morphological features can include rise time, fall time, peak width, peak height, etc.

To identify a particular condition of the electrical device, the analyzer 150 may compare the acquired snapshot of frequency components to stored frequency component templates that represent one or more different conditions of the device. For example, the analyzer 150 may sequentially compare templates until a sufficiently close match is obtained. In some embodiments, the analyzer 150 may compare the snapshot to a template of normal operation and identify an anomalous condition if the snapshot is different from the normal template.

In some embodiments, the analyzer 150 may calculate a correlation coefficient using cross correlation signal matching techniques that involve point-by-point comparison of all or some of the template data points to the snapshot data points. The analyzer may predict that the condition is likely to occur in the future based on the correlation of sequentially obtained snapshots moving toward correlation with the template. In some embodiments, the analyzer may periodically calculate a correlation coefficient that compares the snapshot data points to all or some of the normal operation template. In some embodiments, the analyzer 150 may predict that the operation of the electrical device is deviating from normal operation based on changes in the correlation between the snapshot and the normal template.

The analyzer 150 may develop trends based on any morphological feature of the snapshot signal. The template itself may represent a trend rather than a single point in time. In some embodiments, trends can be based on calculated values, such as an amplitude ratio ratio of frequency components, rise time or fall time of a frequency component, etc. If a snapshot that is sufficiently close to a template or an anomalous trend is identified, the analyzer 150 returns an output indicating the normal or abnormal condition of the electrical device and possibly a prediction of expected time horizon over which the abnormal condition may further worsen and/or need attention.

According to some embodiments, the analyzer 150 may identify eigenfrequencies represented in the time domain signal and determine a condition of the electrical device based on changes in the eigenfrequencies. Furthermore, the analyzer 150 may trend the eigenfrequencies over time and detect or predict the presence and/or amount of a condition of the electrical device based on the trend of eigenfrequencies.

The analyzer 150 may develop a trend of changes in the snapshot frequency component signal over time and detect a change in the presence or amount of the condition based on the trend. In some embodiments, the analyzer develops a correlation between vibration signals (or other sensed signals) at different sensing points and detects a change in the presence or amount of the condition based on a change in the correlation. The analyzer 150 may develop a correlation between two or more different parameters, e.g., vibration and temperature, and detect a change in the presence and/or amount of the condition based on the change in correlation between the different parameters.

Figure 2A:
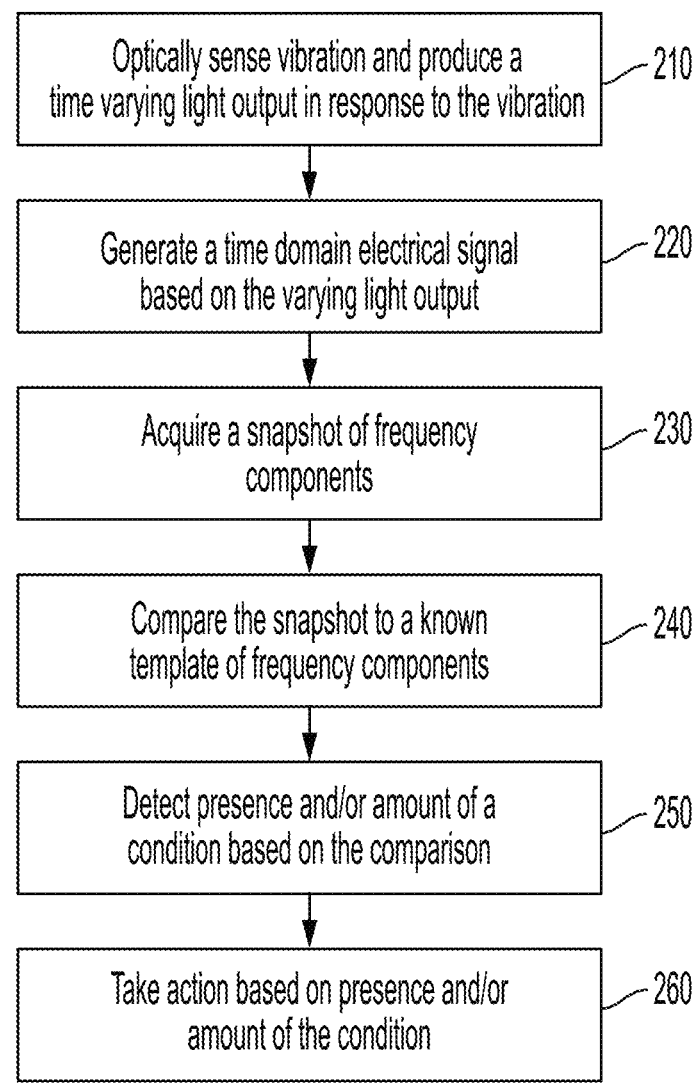
FIGS. 2A and 2B are flow diagrams illustrating a method of operating the system of FIG. 1 in accordance with some embodiments.

FIG. 2A is a flow diagram illustrating a method of operating the sensor system 100 in accordance with some embodiments. The sensor network optically senses 210 vibrations of an electrical device using at least one optical sensor. The vibrations cause variation in the strain of the optical sensor resulting in time varying light output from the sensor. The time varying light output is transduced 220 to a time domain electrical signal by a detector. An analyzer acquires 230 a snapshot of frequency components of the time domain signal over a data acquisition time period. The analyzer compares 240 the snapshot of frequency components to a known frequency component template corresponding to a condition of the electrical device. Based on the comparison, the analyzer determines 250 a presence and/or amount of the condition. In some embodiments the analyzer 250 may determine a time horizon for an anomaly to further worsen and/or need attention. Some action may optionally be taken 260, such as repair, maintenance, and/or replacement of the electrical device, when the condition is detected or the amount of the condition, e.g., corrosion, is determined to be beyond an acceptable level.

Figure 2B:
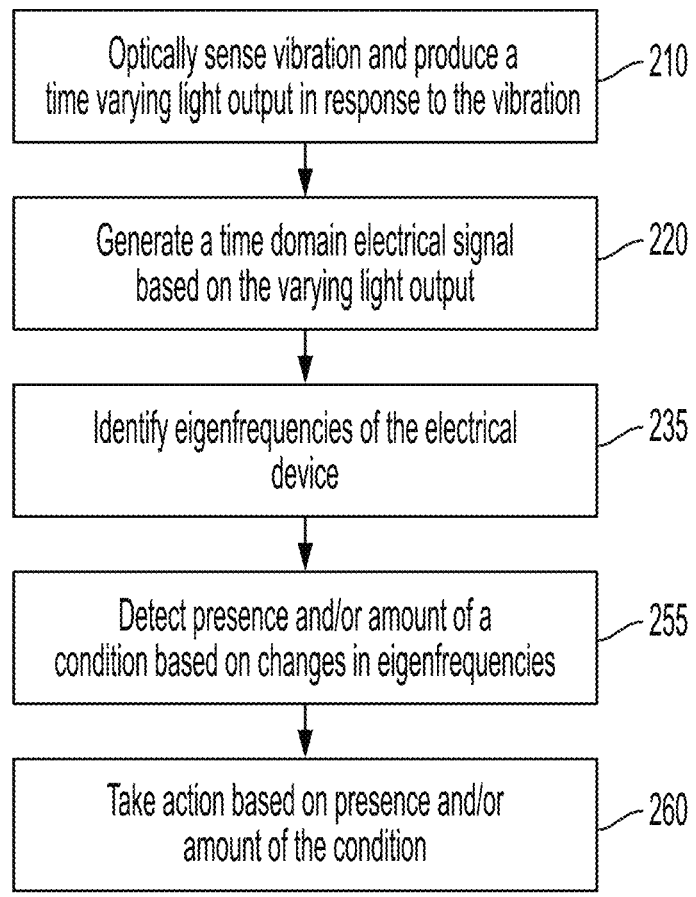

As shown in the flow diagram of FIG. 2B, in some embodiments, the analyzer may identify 235 eigenfrequencies of the electrical device represented in the time domain signal. The analyzer can detect 255 the presence and/or amount of various conditions of the electrical device based on changes in the eigenfrequencies. For example, changes in the eigenfrequencies may include changes in amplitude, frequency and/or damping characteristics upon pulse-like impacts.

The sensor system can include multiple sensors disposed in various locations of the electrical device. At least some of the sensors may be vibration sensors but the sensor system may also include sensors arranged to sense other parameters, e.g., oil level sensors or temperature sensors. For example, one or more temperature sensors may be positioned proximate to the oil level of an oil filled transformer and/or proximate to (e.g., within 1-10 mm) the bottom of the oil tank. At least one temperature sensor may be positioned proximate to a top of the coil of the transformer, proximate to a middle of the coil, and/or proximate a bottom of the coil. Note that the same sensors may be used to sense different parameters of the electrical device taken over different time scales as explained in more detail herein.

Changing conditions of the electrical device changes the frequency components of the vibration signal. The frequency components of the vibration signal may be altered due to an event external or internal to the electrical device. For example the frequency components may change due to a mechanical impact to the outside of the device or from vibration caused by equipment external to the electrical device. Internal conditions within the device may also change the frequency components of the vibration signal, e.g., in cases where the integrity of the mounting of the transformer components such as the coil and core is compromised.

In some configurations, the electrical device is an oil-filled device. The frequency components of the vibration signal may change when there is a change in the oil within the device, such as a change in pressure which may occur when the tank leaks or when an oil sample is taken. The frequency components may change in response to changes in temperature, pressure, or degradation of the oil. The convection of oil within the transformer tank as well as the oil fill level may have an impact on vibration within the transformer.

Over time bolts and/or other parts of the electrical device may loosen, causing a change in the frequency components of the vibration signal. The mechanical mounting of the electrical device can change over time. The condition of loose parts, loose bolts, and/or compromised mechanical mounting of the electrical device may be detected by comparing the frequency components of an acquired vibration signal to a previously acquired frequency component template.

For example consider the scenario in which the electrical device is a transformer. The mechanical mounting of the transformer coil or core to the transformer case (e.g., an oil-filled transformer case) may exhibit changes over time that are detectable in the frequency components of the vibration signal.

Corrosion is a chemical process that can lead to degradation and/or early failure of an electrical device. The presence and/or progression of corrosion of the device may be detected based on changes in the frequency components of the vibration signal.

Events such as energizing or de-energizing the electrical device, magnetizing or de-magnetizing a transformer coil, applying or removing a load, applying or removing a load of a particular type, e.g., inductive, capacitive or resistive, overload, short or open circuit of the device are examples of detectable conditions based on the frequency components of the vibration signal. Monitoring changes in the vibration signal frequency components over time can indicate changes in the electrical device consistent with degradation and/or aging of the electrical device. Also the characteristic response in the frequency spectrum due to an external impact (e.g., car or train passing by) can change suddenly or over time if the structural integrity of the transformer components and/or transformer tank is changing.

Figure 3:
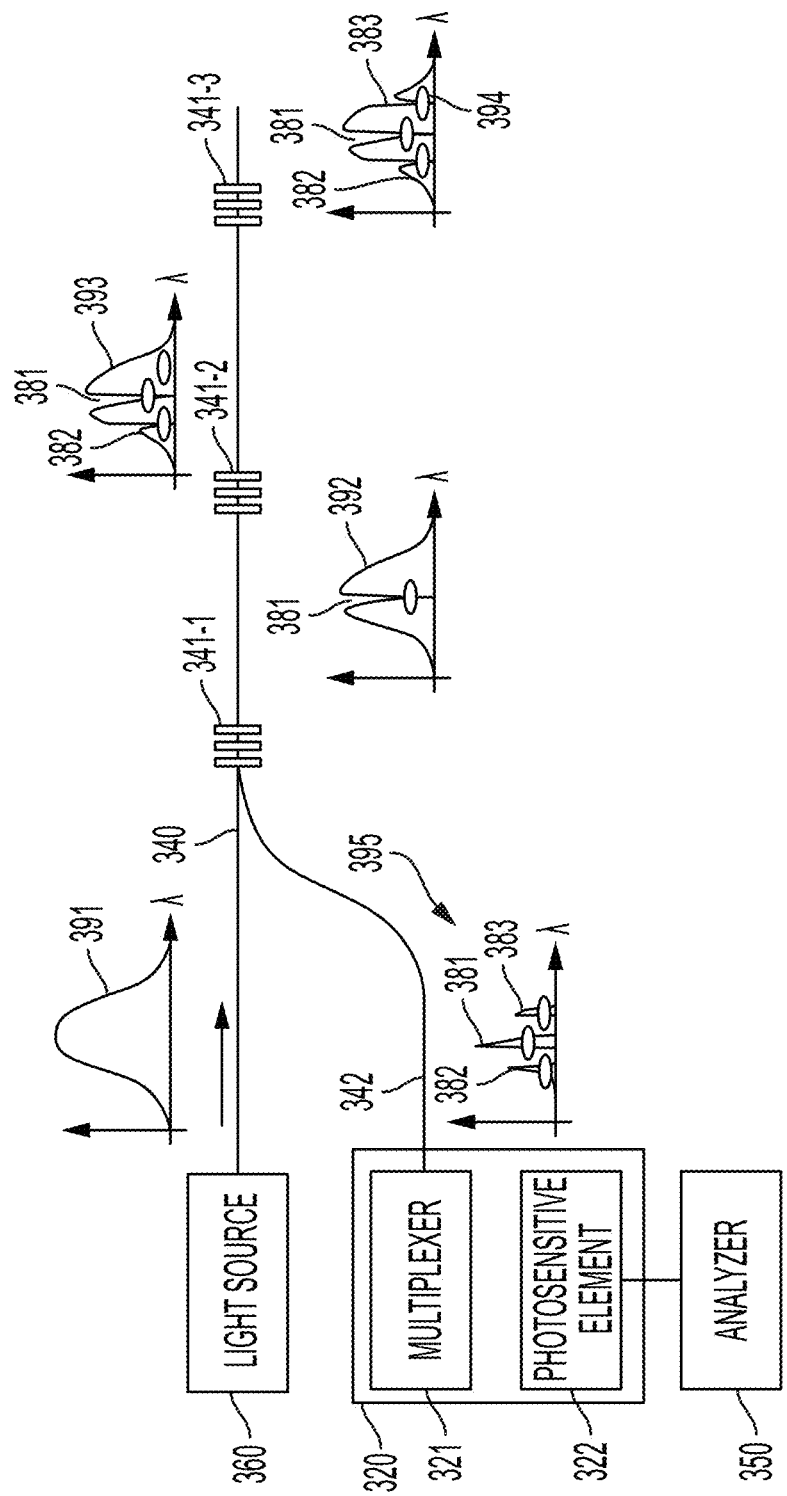
FIG. 3 is a diagram illustrating the operation of the sensor network, detectors, and analyzer in accordance with some embodiments.

FIG. 3 is a diagram illustrating the operation of the sensor network, detectors, and analyzer. The sensors 131, 135 may comprise any type (or multiple types) of optical sensor, including Fiber Bragg Grating (FBG) sensors and/or etalon or Fabry-Perot (FP) sensors. Both the FBG and etalon/FP sensors are collectively referred to herein as optical sensors or fiber optic sensors. Although some examples provided herein are based on FBG sensors, it will be understood that other types of optical sensors could alternatively or additionally be used in the various embodiments discussed herein.

Fiber optic sensors offer many advantages over their electrical counterparts. They are thin, (typically about 100-200 μm) in diameter, lightweight, sensitive, robust to harsh environments, and immune to EMI. Fiber optic sensors can simultaneously measure multiple parameters with high sensitivity in multiplexed (muxed) configurations over long optical fiber cables. Fiber optic sensors have demonstrated robustness to various harsh environments, including long-term (5+ years) exposure to oil-soak environments, as shown for downhole sensing. The most common fiber optic material is silica, which is corrosion resistant, can withstand 1 GPa tension for more than five years, survive between −200° C. and 800° C., and has a dielectric breakdown strength greater than 470 kV/mm. Various types of plastic are also useful for optical fibers and optical sensors. Fiber optic sensors such as FBG sensors are mechanically robust with respect to shock and vibration. Thus, embedded fiber optic sensors in transformers offer an attractive solution to reliably measure and monitor relevant parameters. In addition, the immunity of optical fiber cables to EMI and radio frequency interference (RFI) make it a particularly suitable communication and/or sensing medium for high voltage operating environments in substations and over long distances across the grid. Thus, the multifunctional nature of optical fiber cables can be exploited to combine sensing, communications, shielding, and lightning protection functions in power systems.

FBG sensors can be formed by a periodic modulation of the refractive index along a finite length (typically a few mm) of the core of the optical fiber. In some embodiments the periodic modulation can be inscribed on the fiber optic through direct writing using femtosecond lasers. The modulation pattern reflects a wavelength, called the Bragg wavelength, that is determined by the periodicity of the refractive index profile of the FBG sensor. In practice, the sensor typically reflects a narrow band of wavelengths centered at the Bragg wavelength. The Bragg wavelength at a characteristic or base value of the external stimulus is denoted $\lambda$, and light having a peak, center, or centroid wavelength $\lambda$ (and a narrow band of wavelengths near $\lambda$) is reflected from the sensor when it is in a predetermined base state. For example, the base state may correspond to zero strain due to vibration. When the sensor is subjected to vibration or other stimulus that causes a change in strain, the vibration changes the periodicity of the grating and the index of refraction of the FBG, and thereby alters the reflected light so that the reflected light has a peak, center, or centroid wavelength, $\lambda s$, different from the base wavelength, $\lambda$.

FBG sensors may be sensitive to changes in refractive index n, strain $\epsilon 1$, and ambient temperature changes $\Delta T$, for example. The refractive index n can be made sensitive to the chemical environment of the sensor by stripping the optical fiber cladding over the sensor element region and/or by adding appropriate coatings to this sensitive area. In some implementations, by using multiple FBG sensors that are differently affected by strain and temperature (due to design or mounting), dual fibers or special FBG sensors in combination with data evaluation algorithms, the impacts from strain and temperature on the wavelength shift can be separated. For example, strain and temperature can be separated using a pair of adjacent FBGs at different wavelengths attached to the transformer. One of the two adjacent FBGs can be configured to be sensitive to thermal strain alone using thermally sensitive paste or by enclosing it in a special tubing or duct to avoid mechanical strain effects. The measured wavelength shift of the "reference" FBG sensor in the tubing can be subtracted from the total wavelength shift of the adjacent FBG strain sensor for temperature compensation.

As discussed above, fiber optic sensors are useful for sensing temperature and strain. Vibration can be detected as dynamic strain variations. With suitable coatings and configurations, FBGs and/or other optical sensors can be useful for monitoring current, voltage, chemical environment, and corrosion. For example, some parameters of interest can be mapped to a strain signal on the FBG through special coatings that undergo strain, typically in a linear relationship, in response to the parameter of interest. One or more immediately adjacent optical sensors may be used to compensate for the influence of confounding parameters, such as temperature and/or vibration effects, in order to recover the parameter of interest with high fidelity.

In some implementations, corrosion and/or moisture can be converted into strain signals using suitable coatings and/or by bonding the sensors or sensor coatings to structural components that undergo tensile strain with corrosion.

As another example, chemical sensing can be accomplished by depositing specific chemically sensitive coatings that undergo strain in response to changing concentrations of the chemical species of interest. For example, Palladium (Pd) coatings undergo reversible strain in response to hydrogen-containing gases. Both transformer oil and cellulose have carbon-based molecular structures rich in hydrogen. The decomposition of oil and cellulose forms a large number of byproducts, including combustible and noncombustible gases. Hydrogen is naturally present in most of those compounds. Up to 0.05% volume H2 and short-chain hydrocarbons gas concentration can be an acceptable level for healthy transformers. Optical sensors with Pd coating are useful for detecting hydrogen-based gases. Hydrogen gas sensing with FBGs in free air suggest that Pd-coated FBGs may have about 7 picometer (pm) wavelength shift response for a 1% volume H2 gas concentration change with a response time of about 5 minutes, without accounting for thermal effects. A similar or greater response sensitivity may be achieved for hydrocarbons. With a detection unit resolution of 50 femtometer (fm), a resolution of 0.01-0.02% H2 may be achieved in free air, after accounting for thermal effects. Similar resolution levels may be achievable for dissolved H2 or H-containing gas in oil, enabling a target resolution of about 250 ppm dissolved gas detection.

In some embodiments, the system disclosed herein can be used for detecting acoustic emission, e.g., in the 50-200 kHz frequency range. Acoustic emission can indicate partial discharge events within the insulation of the electrical device. With the high frequency monitoring capability enabled by the approaches discussed herein, acoustic emission detection of fast (up to 1 MHz) dynamic strain signals (up to 1.45 fm/√Hz) from partial discharge acoustic emission may be achieved and used to detect the occurrence of and/or the severity of the partial discharge.

In the embodiment shown in the block diagram of FIG. 1, the sensors 141 are disposed on a single optical fiber 140 that is partially embedded within the electrical device 110. Sensors 145 external to the electrical device are also optionally disposed on the optical fiber. Each of the sensors 141, 145 may operate within a different wavelength band from other sensors on the optical fiber 140. For example, sensor 141-1 may operate within a first wavelength band centered at wavelength $\lambda 1$, sensor 141-2 may operate within a second wavelength band centered at $\lambda 2$, and sensor 141-3 may operate within an third wavelength band centered at $\lambda 3$. Each wavelength band $\lambda 1, \lambda 2, \ldots \lambda 3$ may be selected so that it does not substantially overlap with the wavelength bands of the other sensors.

As illustrated in FIG. 3, the system may optionally include an input light source 360. The detector 320 may comprise an optical demultiplexer 321 and a photosensitive element 322. Optical sensors 341-1, 341-2, 341-3 are optically coupled to the input light source 360. Light source 360 may be a broadband light source that supplies input excitation light across a broad wavelength band that spans the operating wavelength bands of the optical sensors 341-1, 341-2, 341-3. Output light from optical sensors 341-1, 341-2, 341-3 is carried on optical fiber 340 and 342 to a detector 320. In some embodiments, the detector 320 includes an optical demultiplexer 321 and a photosensitive element 322 as illustrated in FIG. 3.

For example, the detector 320 may include a wavelength domain optical demultiplexer 321 that spatially disperses the output light from the optical fiber 342 according to the wavelength of the light. In various implementations, the optical demultiplexer 321 may comprise a linearly variable transmission structure and/or an arrayed waveguide grating, or other optically dispersive element.

The dispersed light from the demultiplexer 321 can be optically coupled to a photosensitive element 322 which may comprise one or more photodetectors. Each photodetector is configured to generate an electrical signal in response to light that falls on the light sensitive surface of the photodetector. Electrical signals generated by the photodetectors of the photosensitive element 322 are representative of the vibrations (or other parameters) sensed by sensors 341-1, 341-2, 341-3. The optical demultiplexer 321 used in conjunction with the photosensitive element 322 allows the sensor signal from each of the sensors 341-1, 341-2, 341-3 to be individually detected. The electrical signals generated by the detector 320 can be analyzed by the analyzer 350 to determine the presence and or amount or progression of a condition of the electrical device (110 shown in FIG. 1).

Broadband light is transmitted by the light source 360, which may comprise or be a light emitting diode (LED) or superluminescent laser diode (SLD), for example. The spectral characteristic (intensity vs. wavelength) of the broadband light is shown by inset graph 391. The light is transmitted via the optical fiber 340 to the first FBG sensor 341-1. The first FBG sensor 341-1 reflects a portion of the light in a first wavelength band having a central or peak wavelength, $\lambda 1$. Light having wavelengths other than the first wavelength band is transmitted through the first FBG sensor 341-1 to the second FBG sensor 341-2. The spectral characteristic of the light transmitted to the second FBG sensor 341-2 is shown in inset graph 392 and exhibits a notch at the first wavelength band centered at $\lambda 1$ indicating that light in this wavelength band is reflected by the first sensor 341-1.

The second FBG sensor 341-2 reflects a portion of the light in a second wavelength band having a central or peak wavelength, $\lambda 2$. Light that is not reflected by the second FBG sensor 341-2 is transmitted through the second FBG sensor 341-2 to the third FBG sensor 341-3. The spectral characteristic of the light transmitted to the third FBG sensor 341-3 is shown in inset graph 393 and includes notches centered at $\lambda 1$ and $\lambda 2$.

The third FBG sensor 341-3 reflects a portion of the light in a third wavelength band having a central or peak wavelength, $\lambda 3$. Light that is not reflected by the third FBG sensor 341-2 is transmitted through the third FBG sensor 341-2. The spectral characteristic of the light transmitted through the third FBG sensor 341-3 is shown in inset graph 394 and includes notches centered at $\lambda 1$, $\lambda 2$, and $\lambda 3$.

Light in wavelength bands 381, 382, 383, having central wavelengths $\lambda 1$, $\lambda 2$ and $\lambda 3$ (illustrated in inset graph 395) is reflected by the first, second, or third FBG sensors 341-1, 341-2, 341-2, respectively, along the FO cables 342 to the detector 320. Vibrations cause the wavelengths reflected by sensors to vary with time. The detector generates a time domain vibration signal in response to the variation in the wavelengths of light reflected by the sensors 341-1, 341-2, 341-3. In some embodiments, the analyzer 350 determines the frequency components of a snapshot of the time domain signal, compares the snapshot frequency components with a frequency component template corresponding to a known condition of the electrical device. The analyzer 350 detects the presence and/or amount of the condition based on the comparison. In some embodiments, the analyzer identifies the eigenfrequencies of the device and detects a change in the devices's condition based on the changes in the eigenfrequencies. In some embodiments, the analyzer 350 may estimate a time horizon for an anomaly to occur, a condition of the device to deteriorate and/or the device to need service based on changes in the frequency components and/or eigenfrequencies of the device.

In some cases, instead of emitting broadband light, the light source may scan through a wavelength range, emitting light in narrow wavelength bands to which the various sensors disposed on the optical fiber 340 are sensitive. The reflected light is sensed during a number of sensing periods that are timed relative to the emission of the narrowband light. For example, consider the scenario where 341-1, 341-2, 341-3 are disposed on an optical fiber 340. Sensor 341-1 is sensitive to a wavelength band (WB1), sensor 341-2 is sensitive to wavelength band WB2, and sensor 341-3 is sensitive to WB3. The light source may be controlled to emit light having WB1 during time period 1 and sense reflected light during a time period 1*a* that overlaps time period 1. Following time period 1*a*, the light source may emit light having WB2 during time period 2 and sense reflected light during time period 2*a* that overlaps time period 2. Following time period 2*a*, the light source may emit light having WB3 during time period 3 and sense reflected light during time period 3*a* that overlaps time period 3. Using this version of optical time domain multiplexing, each of the sensors may be interrogated during discrete time periods.

The optical fiber 340 used for monitoring electrical devices as discussed herein may comprise a single mode optical fiber or may comprise a multi-mode optical fiber. While single mode fiber optic cables offer signals that are easier to interpret, to achieve broader applicability and lower costs of fabrication, multi-mode fibers may be used.

Figure 4A:
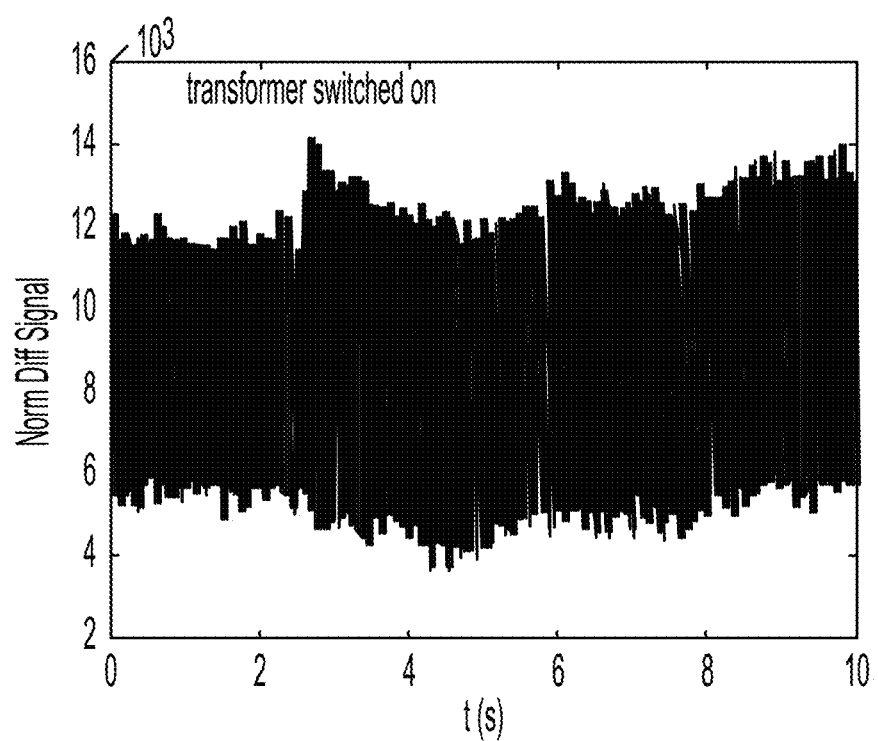
FIGS. 4A through 4C illustrate the operation of converting a time domain signal to snapshot of frequency components in accordance with some embodiments.
Figure 4B:
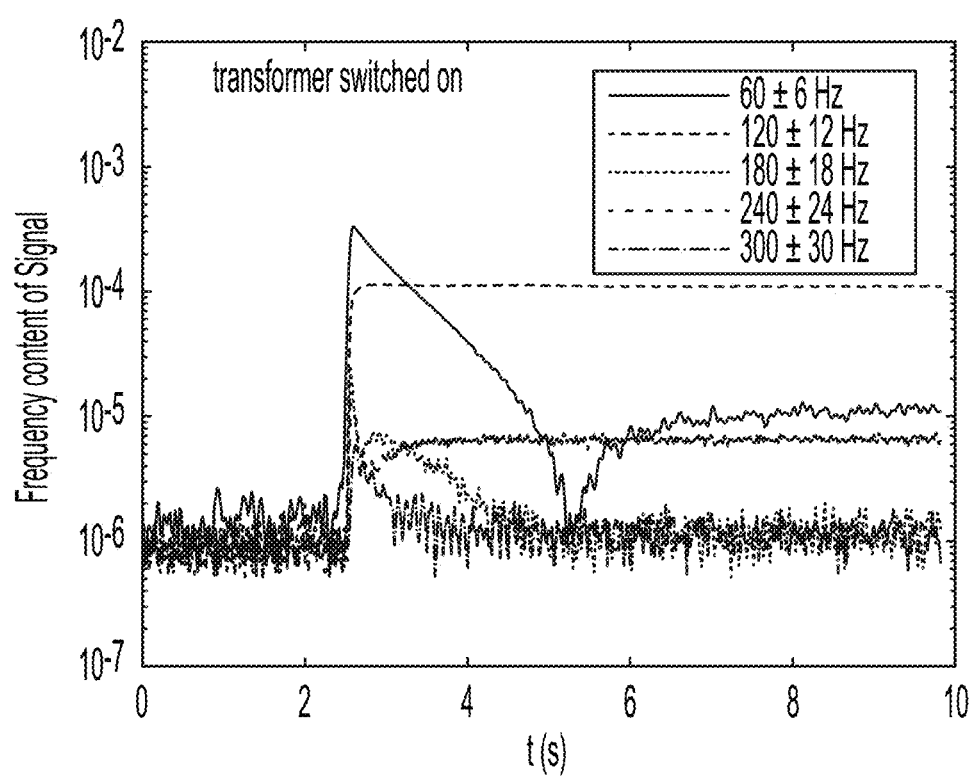
Figure 4C:
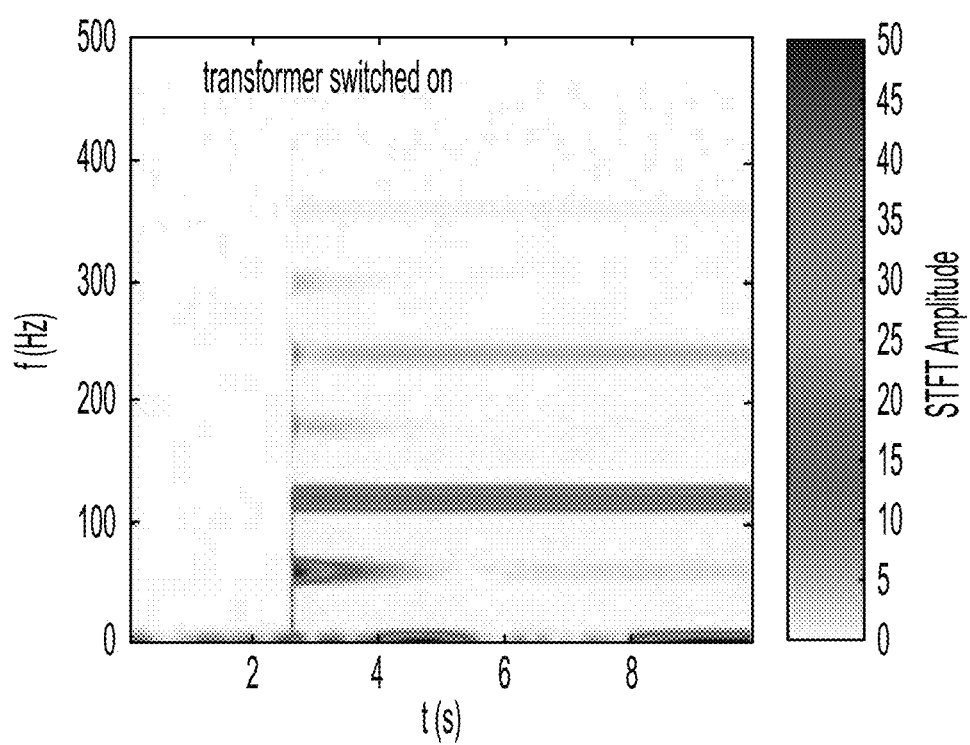

FIGS. 4A through 4C illustrate conversion of a time domain signal to snapshot of frequency components in accordance with some embodiments. A detector transduces a variation in light output from an optical sensor to a time varying signal as shown in FIG. 4A. During a time period of approximately 10 seconds, the electrical device, which in this example is a transformer, is turned on at approximately 2.5 seconds. FIG. 4B shows the variation in frequency content of the 10 second snapshot at 60, 120, 180, and 240 Hz. FIG. 4C shows the variation in frequency content of the 10 second time period at 60, 120, 180, and 240 Hz as a bar chart where the shading of the bars indicates the amplitude of the signal at the frequencies of interest. The condition of energizing or de-energizing the transformer can be detected by comparing the variation in the amplitudes of the frequency components during a time period beginning at 2.5 seconds to the previous amplitudes during 0-2.5 seconds before the switch-on occurs.

Figure 5A:
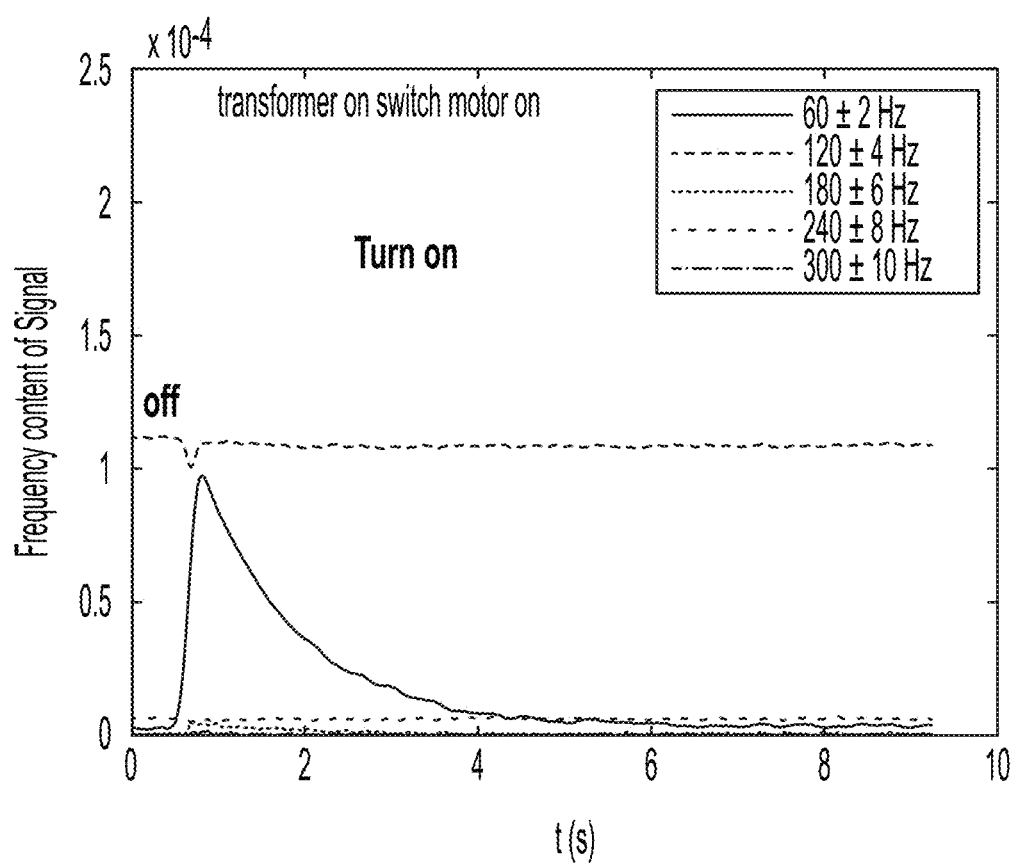
FIGS. 5A through 5C illustrate the variation in frequency components of the time domain vibration signal that can be used to detect connecting or disconnecting a load from the transformer in accordance with some embodiments.
Figure 5B:
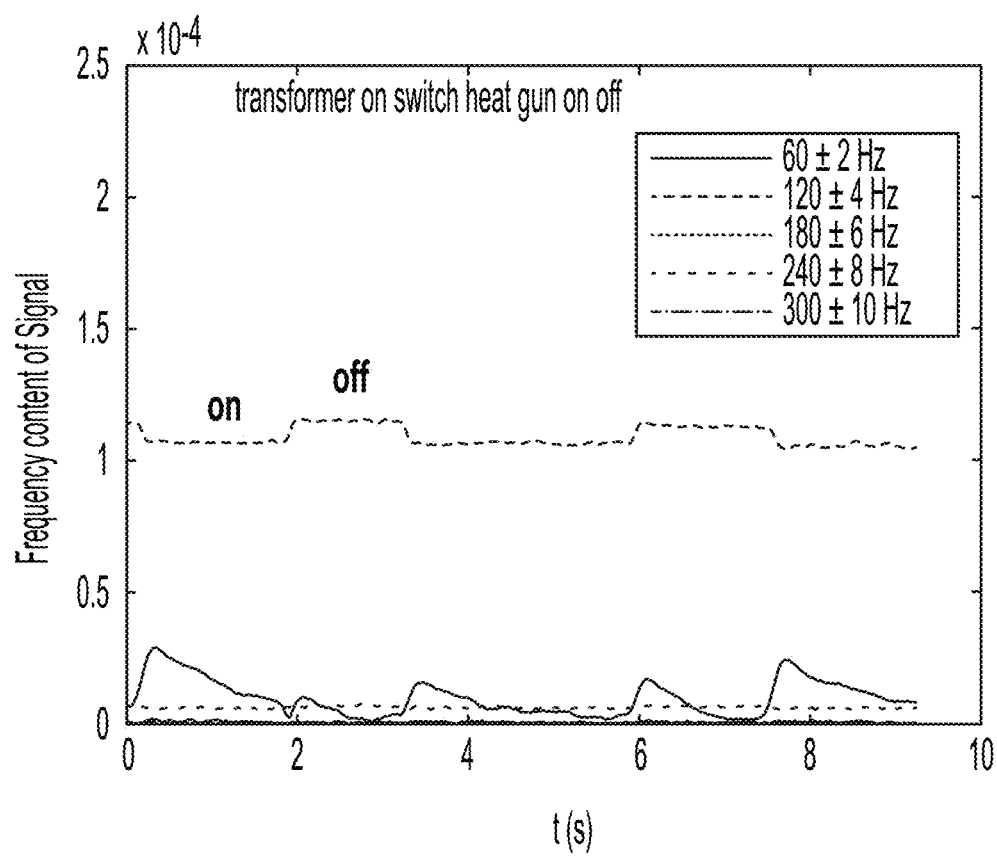
Figure 5C:
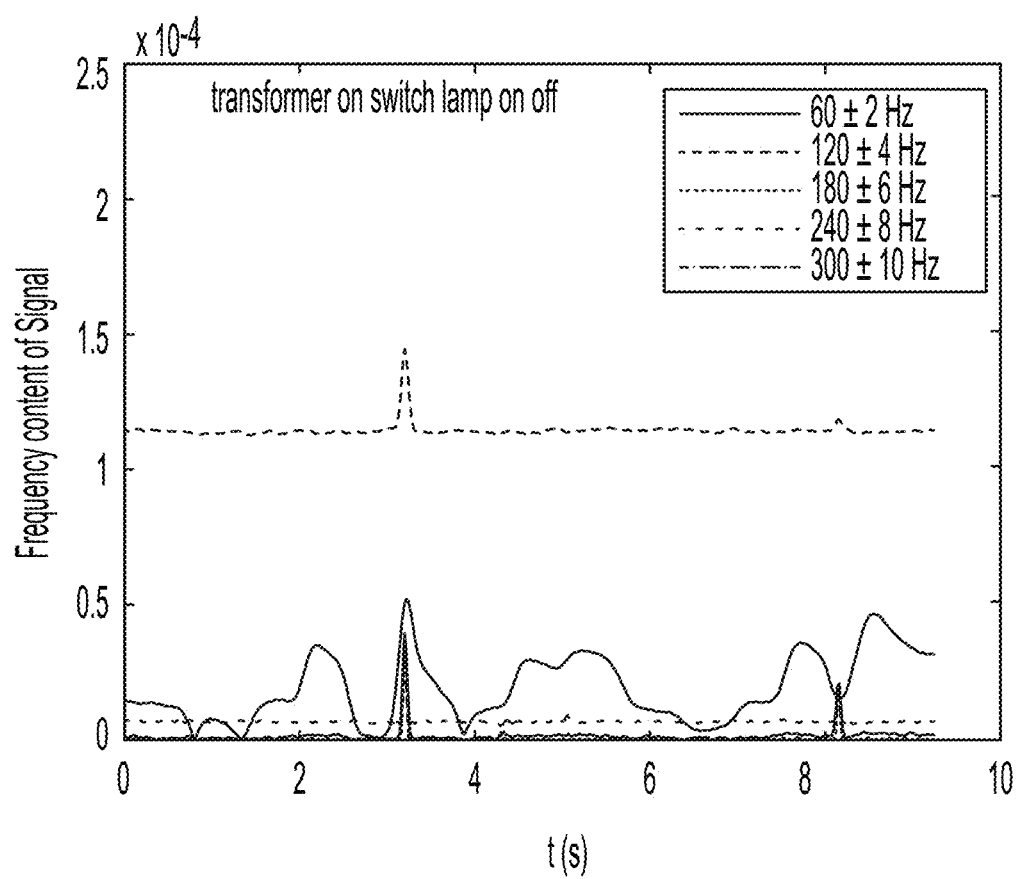

The approach discussed herein can be used to detect the signature, as well as changes of the signature with aging, when a transformer is energized or de-energized as illustrated by FIGS. 4A through 4C above. FIGS. 5A through 5C illustrate the variation in frequency components of the time domain vibration signal that can be used to detect connecting or disconnecting a load from the transformer. The frequency components can also indicate the type of load that is connected and disconnected. FIG. 5A shows the time variation in the amplitude of frequency components during the time period from 0 to 10 seconds when the transformer is powered on and an inductive load (a motor), is connected or disconnected from the transformer. FIGS. 5B and 5C show the time variation in the amplitude of frequency components during a time period of 0 to 10 seconds when the transformer is powered on and resistive loads (a heat gun (FIG. 5B) and a lamp (FIG. 5C)) are connected and disconnected from the transformer. The analyzer can be configured to compare the frequency components' amplitudes over the relevant time period to templates of frequency component amplitudes that represent various conditions such as those discussed in conjunction with FIGS. 4 and 5 to determine the condition of the transformer.

According to some embodiments, the analyzer may detect the condition of the electrical device based on shifts in the eigenfrequencies of the device. At any point in time, the device has characteristic natural resonant frequencies of oscillation referred to as eigenfrequencies. The eigenfrequencies are evident as high amplitude components in the frequency domain signal acquired from the sensors. The frequency domain signal is obtained by performing a time domain to frequency domain conversion of the time varying signal from the detector. If the condition of the device changes, the eigenfrequencies of the device and/or the amplitudes of the signal at the eigenfrequencies may also shift, allowing the analyzer to identify the presence and/or amount of the condition based on changes in the eigenfrequencies.

Figure 6A:
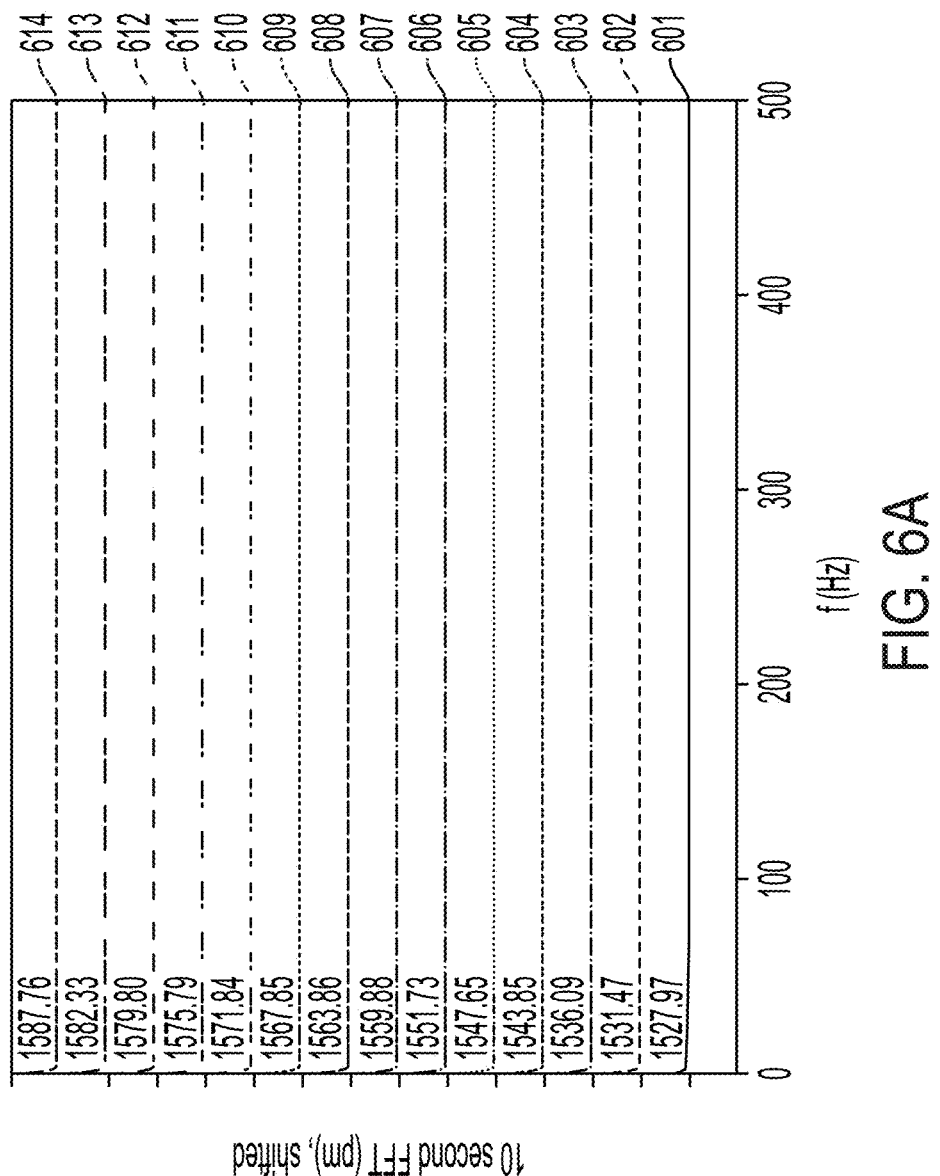
FIGS. 6A through 6E illustrate the shift in the eigenfrequencies of a transformer when the transformer transitions from a non-energized condition to an energized condition in accordance with some embodiments.
Figure 6B:
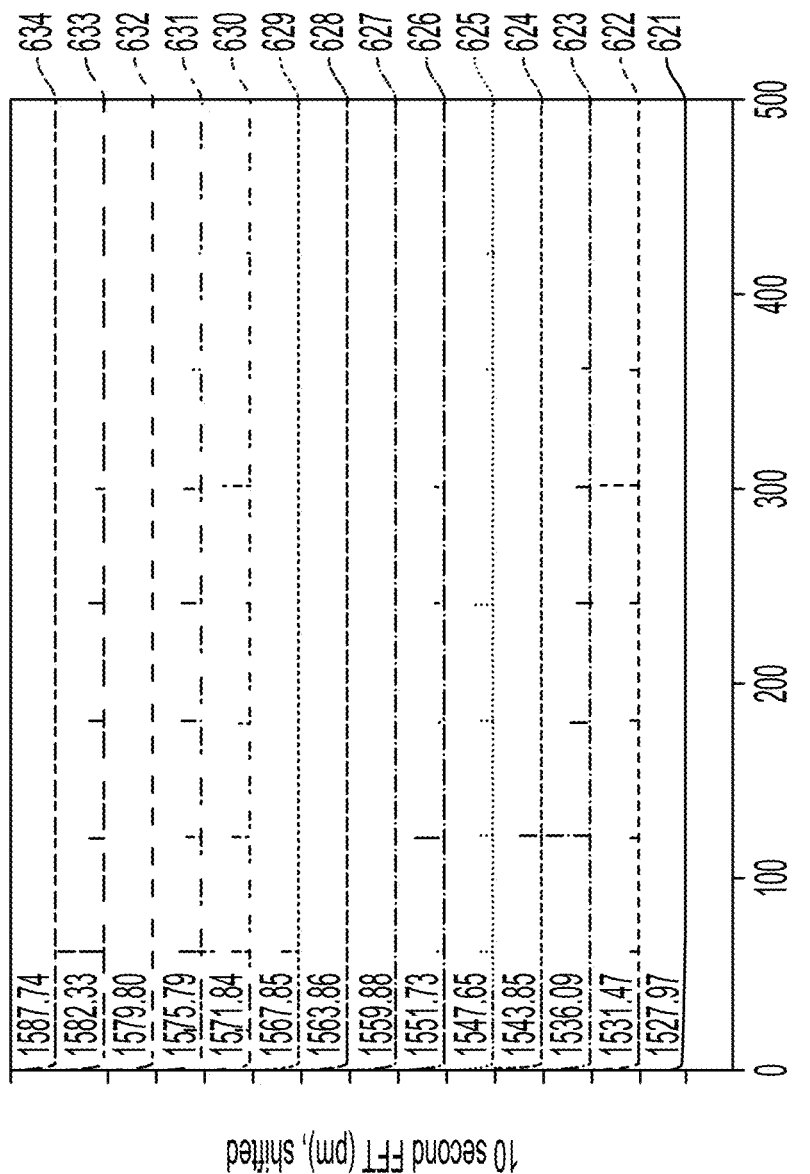
Figure 6C:
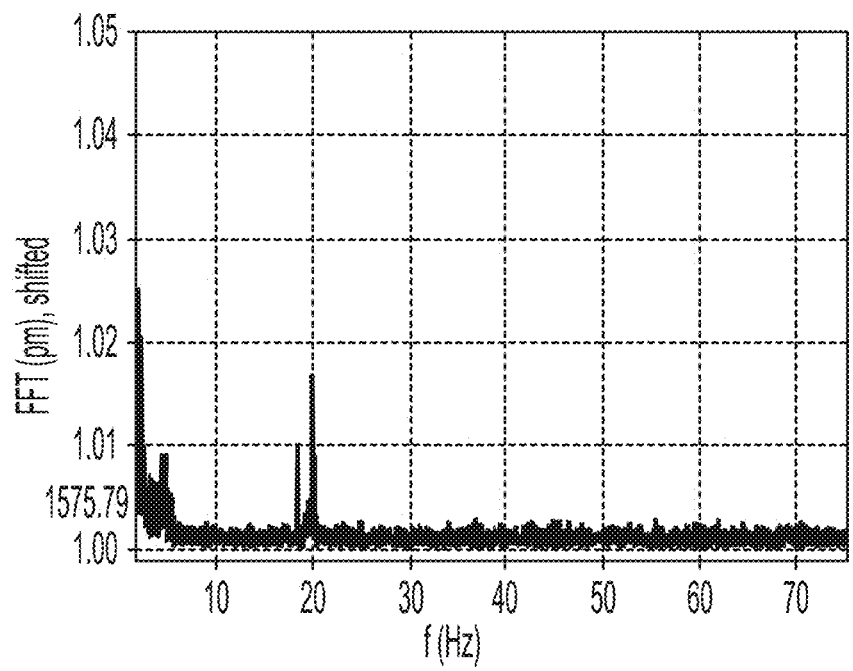
Figure 6D:
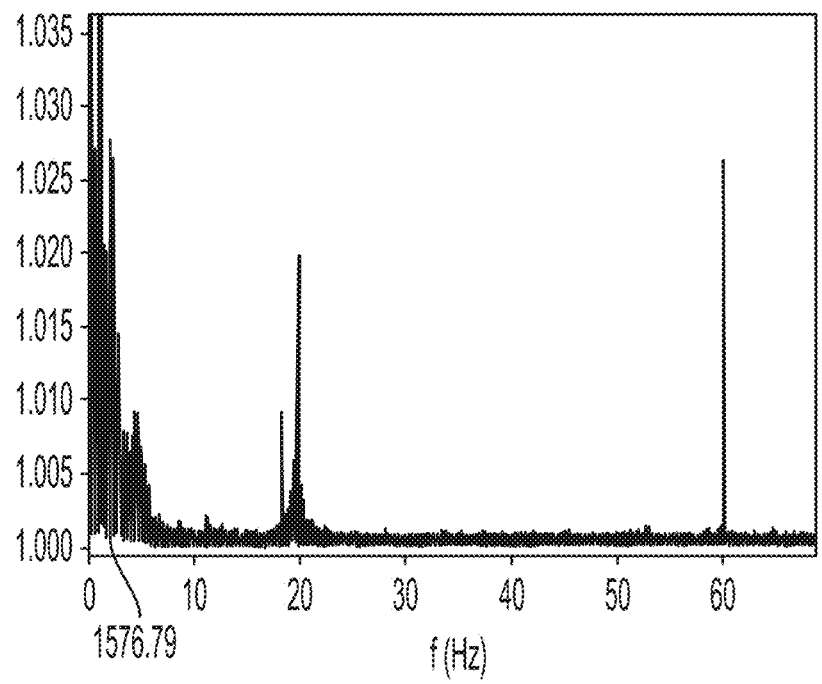
Figure 6E:
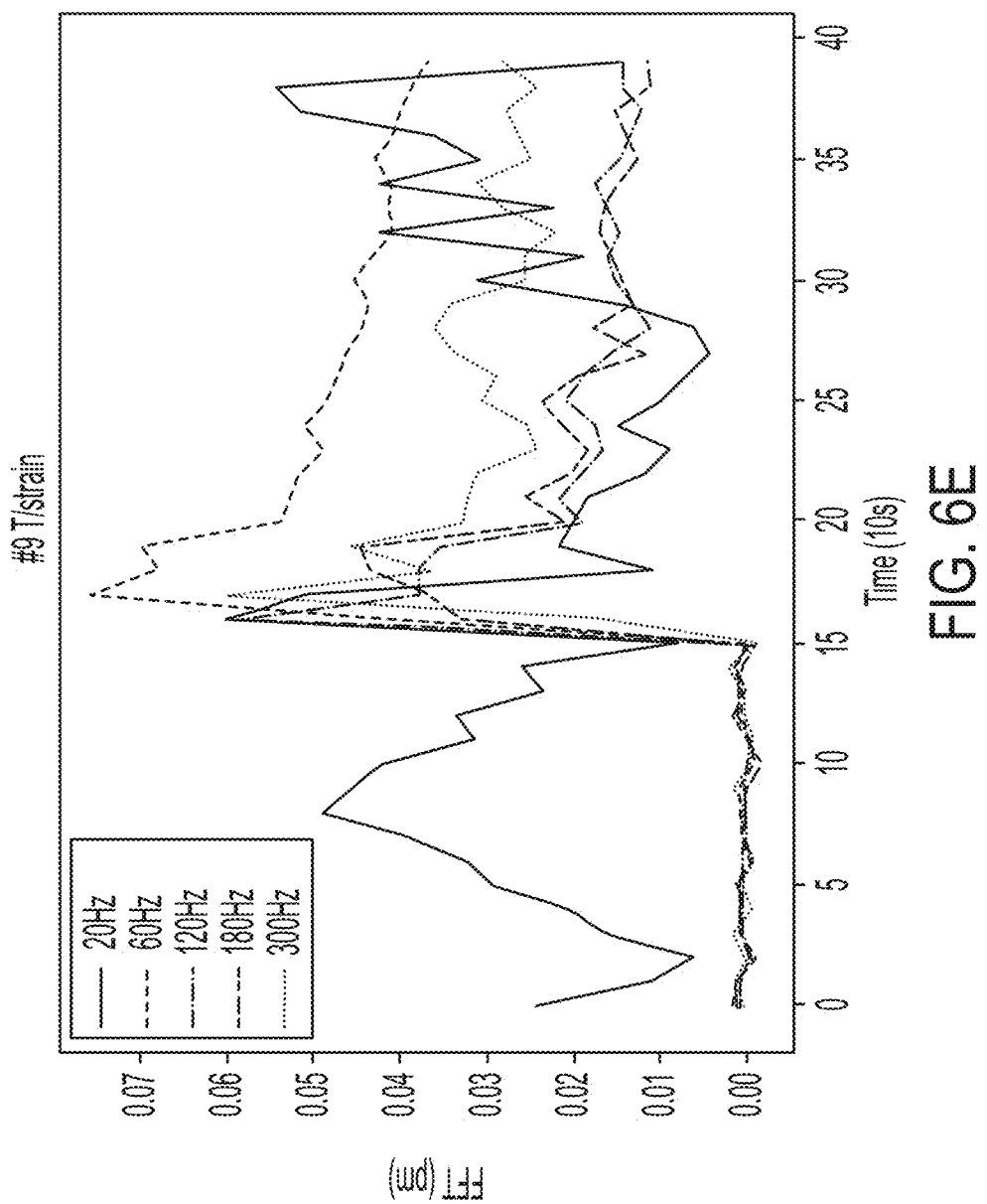

FIGS. 6A-6E illustrate the shift in the eigenfrequencies of a transformer when the transformer transitions from a non-energized condition to an energized condition. FIG. 6A provides plots of frequency domain signals 601-614 obtained from Fourier transform of time domain signals acquired from fourteen sensors internal to the transformer over a 10 second time window during which the transformer is not energized. The sensors operate at different nominal center wavelengths 1527.97 nm, 1531.47 nm, 1536.09 nm, etc., as shown on the left side of the plots 601-614 and 621-634. FIG. 6B provides plots of frequency domain signals 621-634 obtained from Fourier transform of time domain signals acquired from the same fourteen sensors over a 10 second time window during which the transformer is energized. Changes in the amplitude of eigenfrequencies at 60 Hz and higher frequencies, e.g., harmonic frequencies at 120 Hz, 240 Hz, etc., are clearly seen during the energizing event. FIG. 6C is a close up of the plot 611 showing a detailed view of the frequency domain signals of one sensor near 60 Hz before the transformer is energized. FIG. 6D is a close up of the plot 631 showing a detailed view of the frequency domain signals of one sensor near 60 Hz after the transformer is energized. Additionally, lower frequencies at 18.4, 20 Hz are present in some of the sensor signals. Comparison of the plots of 6C and 6D show the change in amplitude at 20 Hz and 60 Hz eigenfrequencies caused by the energizing event. FIG. 6E is a snapshot of the frequency component signal over a data acquisition time period for frequency components at 20 Hz, 60 Hz, 120 Hz, 180 Hz, and 300 Hz. As seen in these figures, the amplitude of the 20 Hz component is varying with time before and after the energizing event which occurs at about 150 seconds. The amplitudes of the 60 Hz, 120 Hz, 180 Hz, and 300 Hz components are relatively constant and small but the amplitudes change significantly when the energizing event occurs.

Figure 7A:
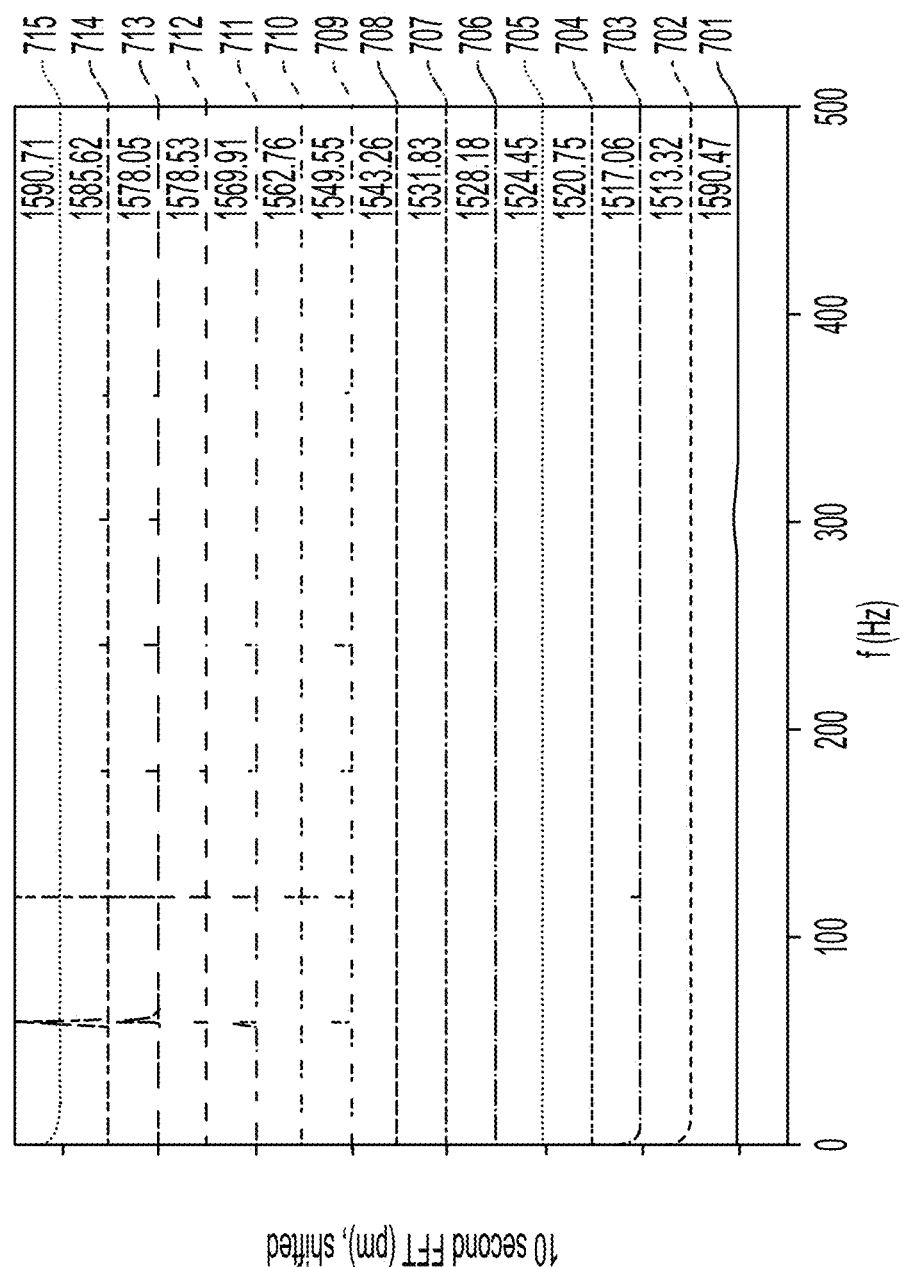
FIGS. 7A, 7B, and 8 illustrate the shift in the eigenfrequencies of a transformer when the transformer is under low, medium, and high loads.
Figure 7B:
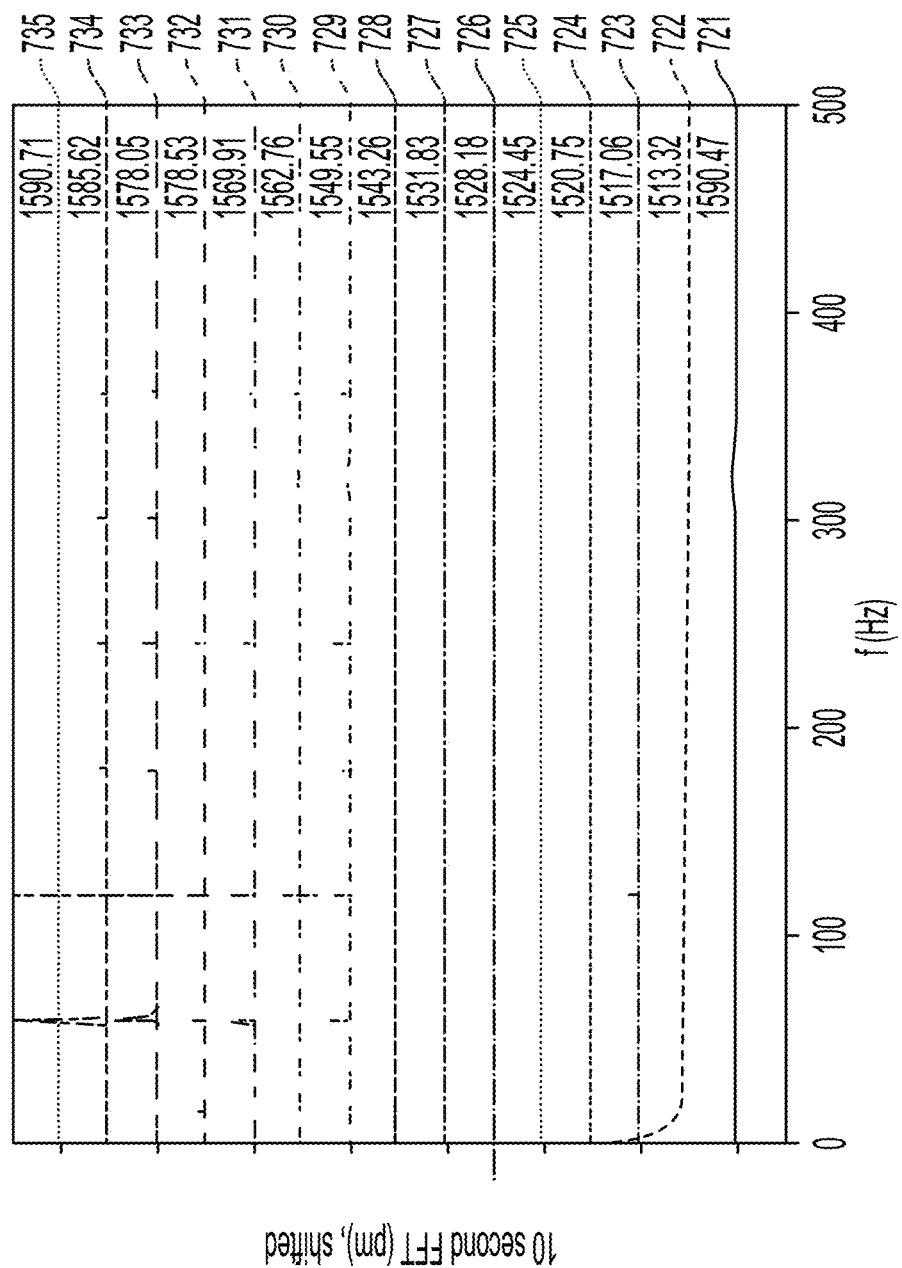
Figure 8:
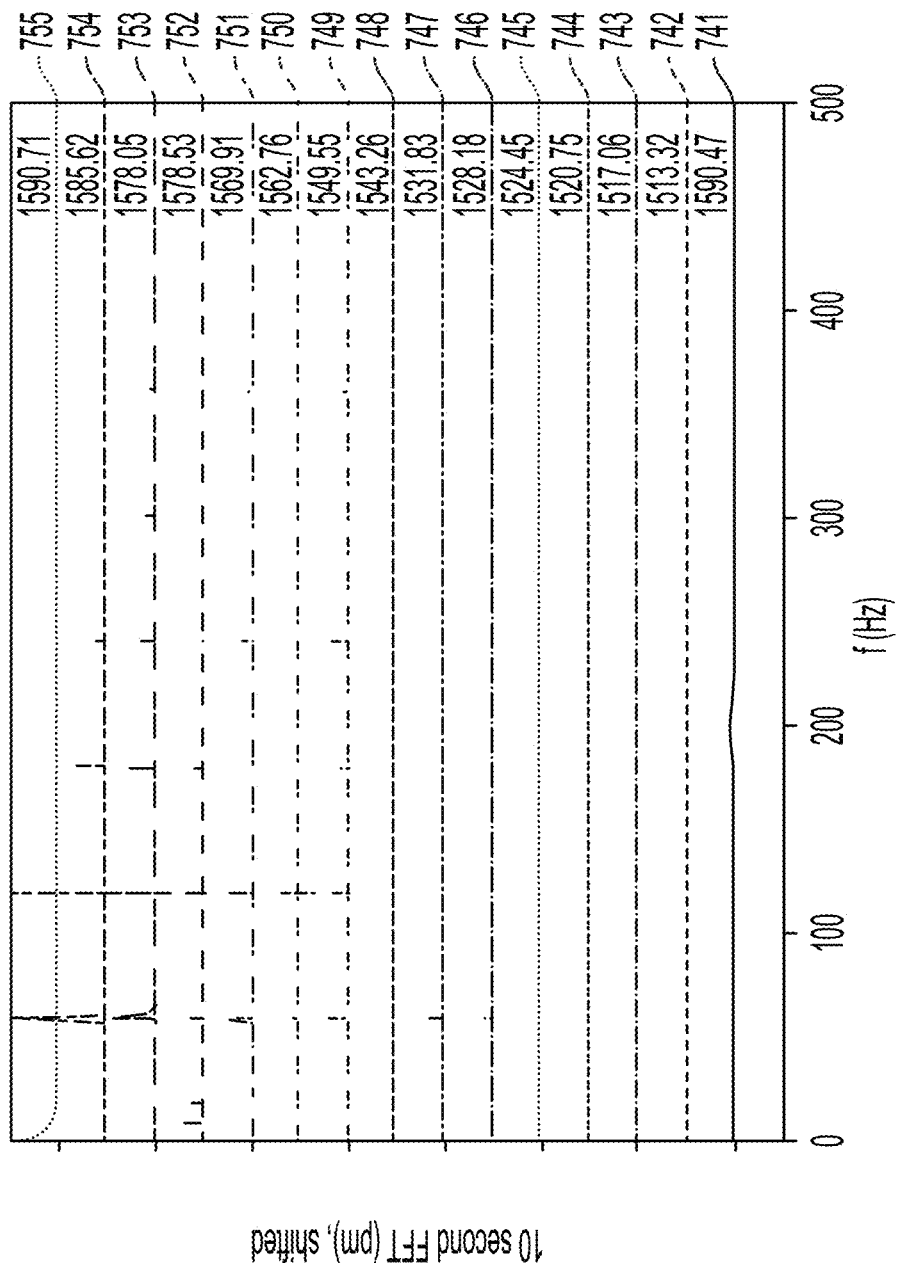

FIGS. 7A, 7B, and 8 illustrate the shift in the eigenfrequencies of a transformer when the transformer is under low, medium, and high loads. FIG. 7A provides plots of frequency domain signals 701-715 obtained from Fourier transform of time domain signals acquired from fifteen sensors internal to the transformer over a 10 second time window during which the transformer is under a low load. The sensors operate at different nominal center wavelengths 1590.47 nm, 1513.32 nm, 1517.06 nm, etc., as shown on the right side of the plots of FIGS. 7A, 7B, and 8. FIG. 7B provides plots of frequency domain signals 721-735 obtained from Fourier transform of time domain signals acquired from the same fourteen sensors over a 10 second time window during which the transformer is under a medium load. FIG. 8 provides plots of frequency domain signals 741-755 obtained from Fourier transform of time domain signals acquired from the same fourteen sensors over a 10 second time window during which the transformer is under a high load. The difference in the amplitudes of the eigenfrequency components change modestly when comparing the plots of the low load and medium load conditions. The difference in the amplitudes of the eigenfrequency components show a readily observable change when comparing the plots at the medium and high loads.

Figure 9A:
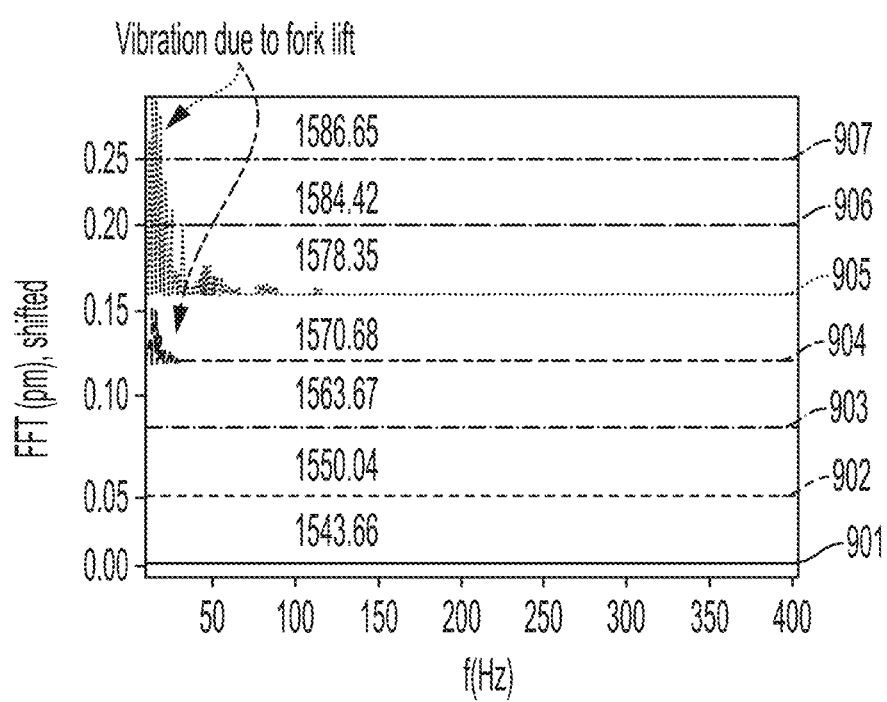
FIGS. 9A and 9B illustrate the shift in the eigenfrequencies of a transformer when the transformer transitions from a non-energized condition to an energized condition in the presence of external vibration.
Figure 9B:
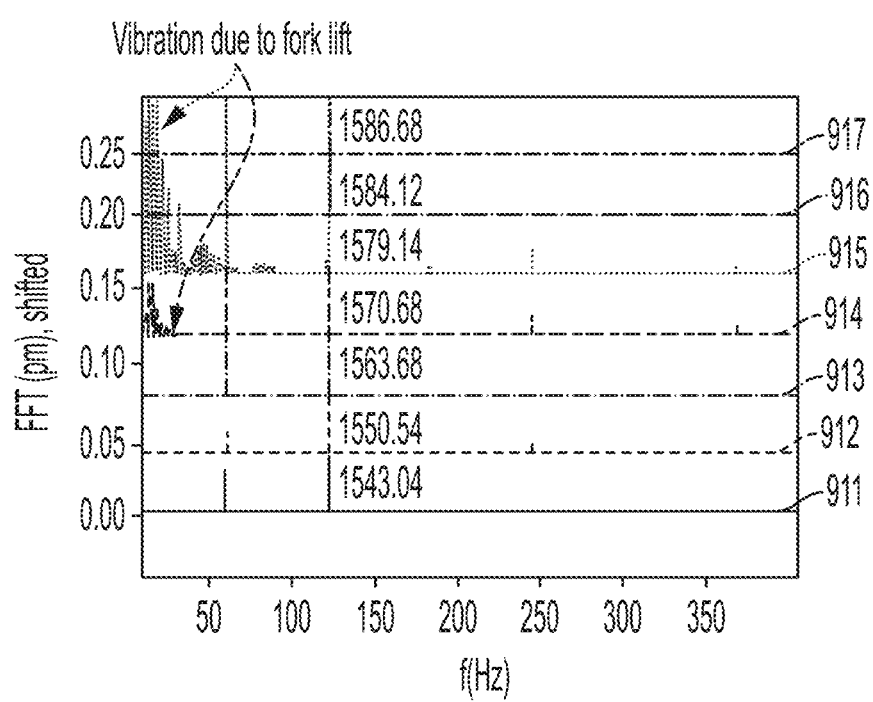

FIGS. 9A and 9B show the frequency vibration spectrum of a transformer for a 10 s time interval while a fork lift is passing by the transformer. In FIG. 9A, plots 901 through 907 are frequency domain plots acquired from the time domain signals sensed by seven optical vibration sensors. In FIG. 9B, plots 911 through 917 are frequency domain plots acquired from the time domain signals sensed by the same seven optical vibration sensors. FIG. 9A shows the vibration spectrum obtained from sensors at a time when the transformer is not energized while FIG. 9B shows the vibration spectrum during a time that the transformer is energized. In both cases a characteristic (eigen-) vibration frequency spectrum of the transformer that was excited by the impact from the fork lift is visible (e.g., see plot 905 which shows broad frequencies peak around 10 Hz, 50 Hz, and 80 Hz). In FIG. 9B the additional 60, 120, 180, 240 Hz frequency components from the transformer operation are also visible. If the structural integrity of the transformer tank, the underlying foundation, and/or or the mounting of the transformer components inside the transformer change, then the vibration eigenfrequencies as well as the amplitude at the eigenfrequencies will change. These changes can be observed and characterized independently and in addition to potential changes of the characteristic frequencies (60, 120, . . . Hz) stimulated by the normal transformer operation.

Changes in the eigenfrequencies can be discernable even in the presence of other factors that affect the vibration sensors. FIGS. 9A and 9B illustrate the shift in the eigenfrequencies of a transformer when the transformer transitions from a non-energized condition to an energized condition in the presence of external vibration. FIG. 9A provides plots of frequency domain signals 901-907 obtained from Fourier transform of time domain signals acquired from seven sensors internal to the transformer over a 10 second time window during which the transformer is not energized. The sensors operate at different nominal center wavelengths shown on the left side of the plots 901-907 and 911-917.

FIG. 9B provides plots of frequency domain signals 911-917 obtained from Fourier transform of time domain signals acquired from the same seven sensors over a 10 second time window during which the transformer is energized. During the time of the plots of FIGS. 9A and 9B, a fork lift near the transformer causes vibrations that are picked up by the seven sensors. The vibrations due to the transformer are evident in the plots of 901-907 and 911-917 at frequencies. Changes in eigenfrequencies at 60 Hz and higher frequencies, e.g., harmonic frequencies at 120 Hz, 240 Hz, etc., are clearly seen after the transformer's transition from a non-energized condition to an energized condition.

In some embodiments, a sensor system including optical sensors can be configured to sense multiple parameters of the electrical device over multiple data acquisition periods that have different time scales. In some implementations the multiple data acquisition systems may be overlapping. These embodiments are applicable when a first parameter causes changes in the light output of a sensor at a relatively high frequency in comparison to a second parameter which causes changes in the light output of the optical sensor at a relatively lower frequency. As an example, the first parameter may be vibration which causes relatively high frequency changes in the light output of the sensor and the second parameter may be temperature or mechanical stress which cause relatively low frequency changes in the light output of the sensor. The detector transduces the relatively high and low frequency variation in light output into an electrical signal that also includes the relatively high and low frequency components. Changes in the first parameter are determined based on the relatively high frequency components and changes in the second parameter are determined based on the relatively low frequency components in the electrical signal.

Referring again to FIG. 1, according to embodiments in which multiple parameters are sensed, at least one of the sensors 141, 145 is capable of sensing multiple parameters, such as vibration, acoustic emission, temperature, chemical changes, etc. Vibration and acoustic emission are parameters that cause relatively high frequency changes in the light output of the sensor and temperature is a parameter that causes relatively low frequency changes in the light output of the sensor. The detector 120 generates an electrical time domain signal in response to both the high and low frequency variations in light output from the sensor. The analyzer 150 can be configured to identify changes in the first parameter which causes high frequency variations (e.g., vibrations of the electrical device) based on analysis of the time domain signal of the optical sensor over a first data acquisition period. The first data acquisition period may be on the order of about 1 to 10 seconds or up to one minute, for example. The analyzer is configured to identify changes in the second parameter (e.g., temperature of the electrical device) based on analysis of the time domain signal of the optical sensor over a second data acquisition period. The second data acquisition period may be on the order of about 0.5 to about 30 minutes, for example.

An example of this scenario is the vibration caused by transformer operation, e.g., at 60 Hz and higher harmonics versus lower frequency vibrations due to mechanical impacts as illustrated in FIGS. 9A and 9B that can be clearly differentiated in the frequency domain.

According to some embodiments, the sensor network may comprise many sensors disposed within the electrical device. The analyzer may be capable of developing a distribution of a sensed parameter, e.g., temperature within the device. For example, determining the temperature distribution and tracking the changes in the temperature distribution may be useful to identify thermal convection and heat transfer within the electrical device. The convection of oil within the transformer tank as well as the oil fill level have an impact on vibration of the transformer. The analyzer may use information from multiple parameters, e.g., vibration, temperature, oil fill level, etc., to make a determination about the condition of the electrical device.

Figure 10:
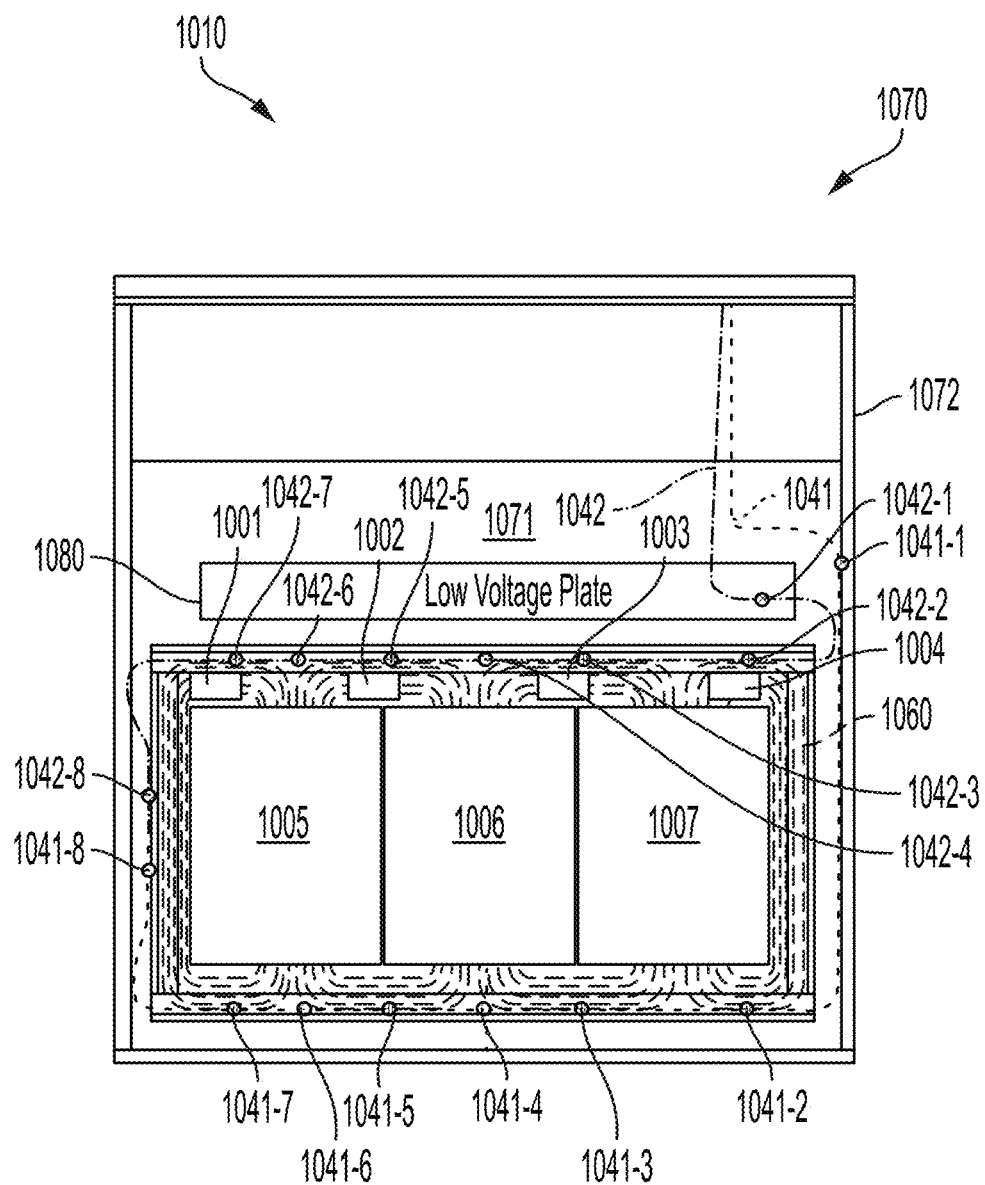
FIG. 10 is a diagram of an oil-filled transformer illustrating example placement of vibration sensors in accordance with some embodiments.

Proper placement of the internal or external optical sensors facilitates obtaining good information for determining the state or condition of the electrical device. In the case of sensors that are capable of detecting vibration, the sensors may be rigidly attached to one or more components of the electrical device. For example, as illustrated in FIG. 10, in one scenario, the electrical device is an oil-filled transformer 1010 that includes four cores 1001, 1002, 1003, 1004, and three coils 1005, 1006, 1007 disposed within a frame 1060. The frame 1060 is at least partially submerged within oil 1071 contained within an oil tank 1070 (also referred to herein as a case). The low voltage plate 1080 of the transformer is arranged within the oil tank 1070 and above the frame 1060 in FIG. 10.

In this example, the sensor network includes two optical fibers 1041, 1042. Optical fiber 1041 includes eight optical vibration sensors 1041-1-1041-8. Optical sensor 1041-1 is attached to the interior surface of a wall 1072 of the oil tank 1070; optical sensor 1041-2 is attached to the fourth core 1004; optical sensor 1041-3 is attached to the third core 1003; optical sensor 1041-5 is attached to the second core 1002; optical sensor 1041-7 is attached to the first core 1001; optical sensor 1041-4 is attached between the second core 1002 and the third core 1003; optical sensor 1041-6 is attached between the first core 1001 and the second core 602; and optical sensor 1041-8 is attached to an external surface of the frame 1060.

Optical fiber 1042 includes eight optical vibration sensors 1042-1-1042-8. Optical sensor 1042-1 is attached to the low voltage plate 1080; optical sensor 1042-2 is attached to the top of fourth core 1004; optical sensor 1042-3 is attached to the third core 1003; optical sensor 1042-5 is attached to the second core 1002; optical sensor 1042-7 is attached to the first core 601; optical sensor 1042-4 is attached between the second core 1002 and the third core 1003; optical sensor 1042-6 is attached between the first core 1001 and the second core 1002; and optical sensor 1042-8 is attached to an external surface of the frame 1060.

To sense relative movement between two components, the vibration sensor may be rigidly mounted to two components as is shown for sensors 1041-4, 1041-6, 1042-4, and 1042-6. For example, a first end of the optical sensor can be rigidly attached to a first component and an opposing second end of the optical sensor can be rigidly attached to the second component. Alternatively, the optical fiber upon which the vibration sensor is deployed may be rigidly mounted to the two components such that the vibration sensor is disposed between the two components. Either one of these techniques for sensing relative movement can be used to sense relative movement between components, for example between two cores of the transformer, or between the core and frame. Sensing relative movement is particularly useful to determine if the mounting bolts for the components are loosening over time.

FIG. 10 illustrates a situation with just a few vibration sensing points along two optical fibers, however, it will be understood that optical sensing as discussed herein can enable a large number of sensing points, e.g., several hundred optical sensors, along a single optical fiber. In other cases (e.g., a smaller transformer) even a smaller number (one or more) of sensing points may be sufficient.

Figure 11:
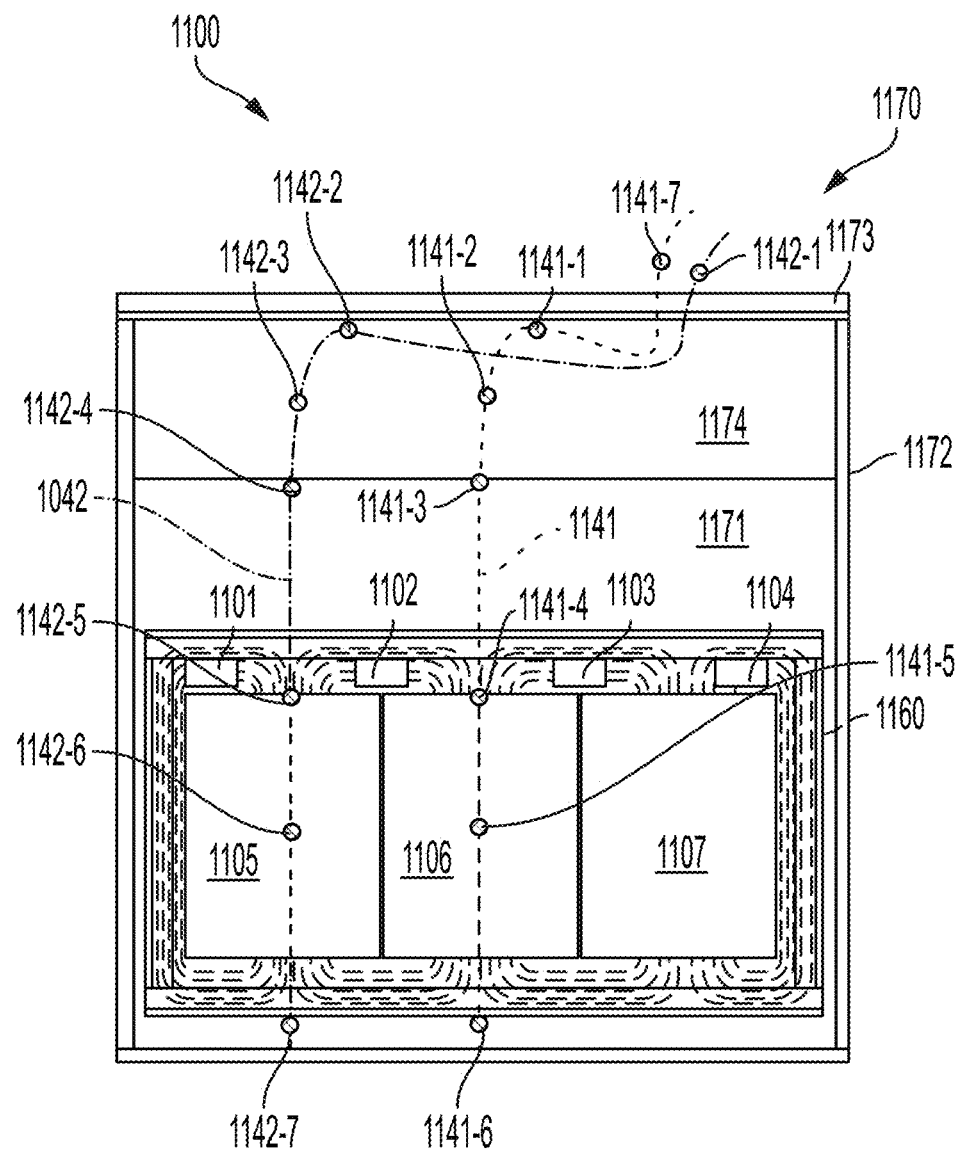
FIG. 11 is a diagram of an oil-filled transformer illustrating example placement of temperature sensors in accordance with some embodiments.

Temperature within the electrical device can be used alone or in conjunction with other sensed parameters, e.g., vibration, oil level, etc., to determine the condition of an electrical device. FIG. 11 is a diagram illustrating various temperature sensing points of interest within a distribution transformer 1110 that includes three coils 1105, 1106, 1107 and four cores 1101, 1102, 1103, 1104 within a frame 1160. The sensor network in FIG. 11 could be used alone or in conjunction with the vibration sensors illustrated in FIG. 10 for example. The sensor network in this example includes two optical fibers 1141, 1142 that include sensors arranged for sensing temperature of the transformer 1110. The temperature sensors may be loosely or rigidly attached to components of interest or may be located near certain components but not attached. For example, the sensors may float in oil near the components. This has the advantage that these sensors are not affected by changes in static strain. In any scenario, the temperature sensors are sufficiently thermally coupled to the component or region of the electrical device so that they can sense temperature changes of the component or region.

Optical fiber 1141 includes seven optical sensors 1141-1-1141-7 arranged for sensing the internal and external temperature of the electrical device 1110, in particular along coil 1105. Optical sensor 1141-1 is located near or attached to the interior surface of the lid 1173 of the oil tank 1170; optical sensor 1141-2 is located within the headspace 1174 of the transformer above the oil 1171; optical sensor 1141-3 is located at the surface of the oil 1171; optical sensor 1141-4 is located at or near the top of the second coil 1106; optical sensor 1141-5 is located at or near the middle of the second coil 1106; optical sensor 1141-6 is located at or near the bottom of the oil tank 1170; and optical sensor 1141-7 is located external to the transformer 1110.

Optical fiber 1142 includes seven optical sensors 1142-1-1142-7 arranged for sensing the internal and external temperature of the electrical device 1110. Optical sensor 1142-1 is located external to the transformer 1110. Optical sensor 1142-2 is located near or attached to the interior surface of the lid 1173 of the oil tank 1170; optical sensor 1142-3 is located within the headspace 1174 of the transformer above the oil 1171; optical sensor 1142-4 is located at the surface of the oil 1171; optical sensor 1142-5 is located at or near the top of the first coil 1105; optical sensor 1142-6 is located at or near the middle of the first coil 1105; optical sensor 1142-7 is located at or near the bottom of the oil tank 1170. As discussed before with regard to FIG. 10, FIG. 11 also illustrates just a few temperature sensing points but will be appreciated that additional sensing points could be used in some implementations.

Corrosion is an important cause of failure for many grid assets. Temperature and/or vibration sensing may be particularly useful to detect corrosion of the transformer oil tank and/or other components. Corrosion of the transformer tank and its components is the number one source for failure of many grid assets. Periodic inspections during routine maintenance do take place but due to the large number of transformer vaults in major cities a considerable amount of corrosion can occur between these inspections. Also the degree of corrosion is often difficult to quantify by visual inspection making predictive failure difficult. Using fiber optic sensing for monitoring the temperature distribution inside a transformer tank, precise monitoring of the oil level and/or monitoring the vibration spectra of the transformer components enable multiple means to remotely monitor the amount of corrosion occurring in the transformer vault in real time so that action can be taken before a major failure occurs.

Details of the vibration spectrum, e.g., from mechanical impacts or magnetization/demagnetization of transformer core, at different sensing points on the transformer wall and/or from different transformer components will change if the structural integrity of the transformer is affected by corrosion. Changes in the vibration spectrum arise from changes in the mechanical eigenfrequencies of the device when structural integrity is compromised. The vibration distribution over different components will change if the mounting of the components or the structural integrity of the tank is compromised by corrosion. Identifying degradation in the structural integrity of an oil-filled transformer allows for early indication of corrosion even far before oil starts leaking out of the tank.

Optionally, the sensing network may include a liquid-level sensor that can be used to detect very small (mm) changes in the oil level so as to identify small oil leaks in the transformer even well before the oil level is getting critically low. For example, the oil level sensor may comprise one or more optical sensors on an optical fiber of the sensor network.

Also at later stages of corrosion when the oil level is already lowered due to oil leakage the features in the vibration spectra are impacted and the corrosion can be detected based on vibration sensing alone or in combination with temperature and/or oil level sensing. The temperature distribution within the transformer tank is also an indicator of corrosion as discussed in U.S. patent application Ser. No. 16/662,655 filed Oct. 24, 2019 and U.S. patent application Ser. No. 16/662,726 filed Oct. 24, 2019 which are hereby incorporated by reference in their entireties. As previously discussed, at least some of the sensors used to detect changes in the temperature distribution over a longer time scale may also be used to detect vibration over a shorter time scale. Thus, the same sensors could first be used to detect changes in a transformer condition based on vibration and subsequently confirm changes in the transformer condition based on temperature. The reverse is also possible wherein the transformer condition is first detected based on temperature sensing where the same sensors are used to confirm the transformer condition based on vibration sensing.

Inserting optical fibers in transformers and/or other electrical devices during the manufacturing process or retrofitting existing electrical devices with optical fibers can be challenging. Ducts are often used for cooling the coils by allowing oil convection close to the coil. According to some embodiments discussed below, optical fibers can be guided through ducts in a transformer during the manufacturing process. According to some embodiments, transformers can be initially fitted or retrofitted with an optical fiber sensing rod comprising one or more fiber optic sensors with one or more sensing points or the sensing rod could alternatively be inserted during the manufacturing process.

Figure 12A:
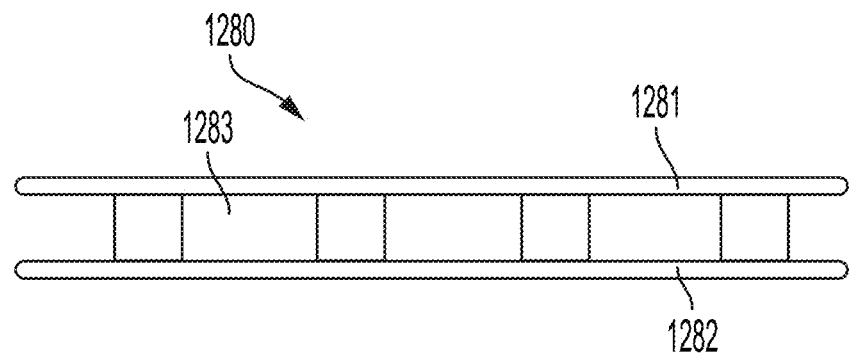
FIG. 12A is a cross sectional diagram that conceptually illustrates an insulator made of layers with ducts between the layers.

Transformers generally include an insulator between the primary and secondary windings. FIG. 12A is a cross sectional diagram that conceptually illustrates an insulator 1280 made of layers 1281, 1282 with ducts 1283 between the layers 1281, 1282. Paper is typically used for the layers 1281, 1282, however, many other electrically insulative materials are also suitable.

Figure 12B:
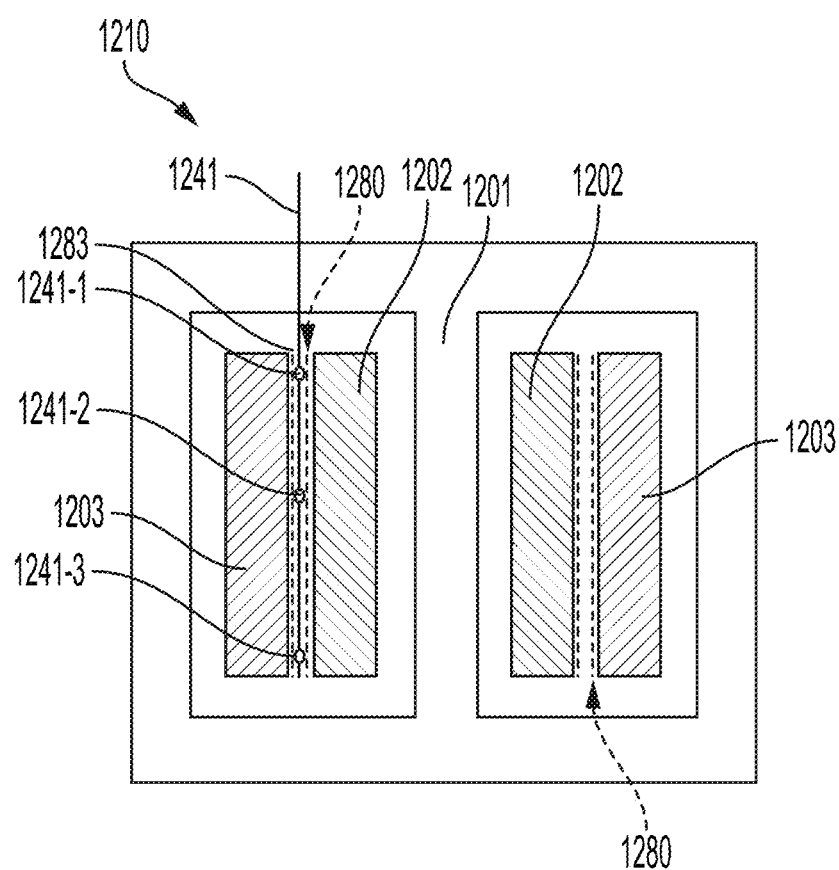
FIG. 12B shows a transformer with an optical fiber inserted within the ducts of an insulator within the transformer in accordance with some embodiments.

FIG. 12B illustrates a transformer 1210 that includes primary 1202 and secondary 1203 windings and a core 1201. An insulator 1280 having ducts 1283 is disposed between the primary 1202 and secondary 1203 windings. The ducts 1283 enhance convection and energy dissipation.

The ducts 1283 in the insulator 1280 provide convenient structures for inserting an optical fiber 1241 as illustrated in FIG. 12B. The optical fiber may include multiple optical sensors 1241-1, 1241-2, 1241-3 configured for sensing temperature and/or other transformer parameters. The use of the ducts between windings allows for monitoring the temperature distribution of the transformer close to the transformer coils as well as monitoring the efficiency of oil convection.

Figure 13A:
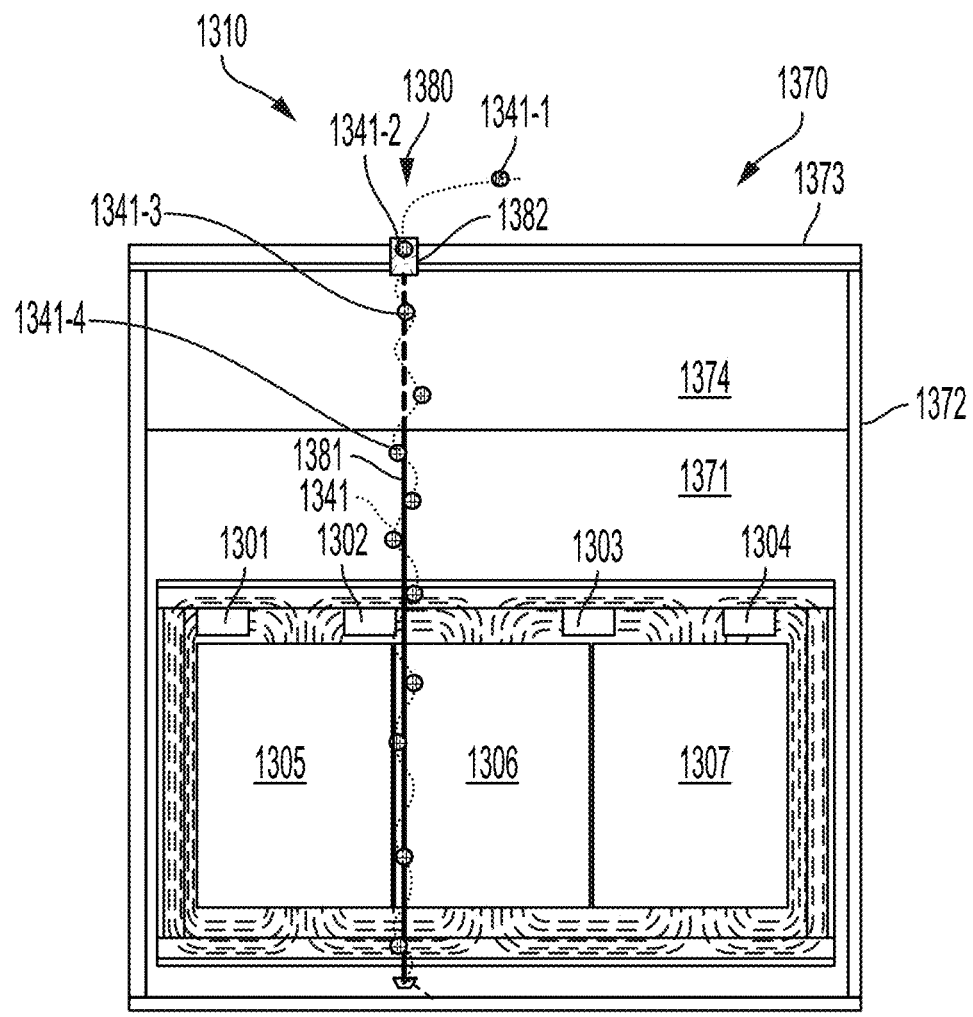
FIGS. 13A and 13B respectively show front and side cross sectional views of a transformer into which the sensing rod has been inserted in accordance with some embodiments.
Figure 13B:
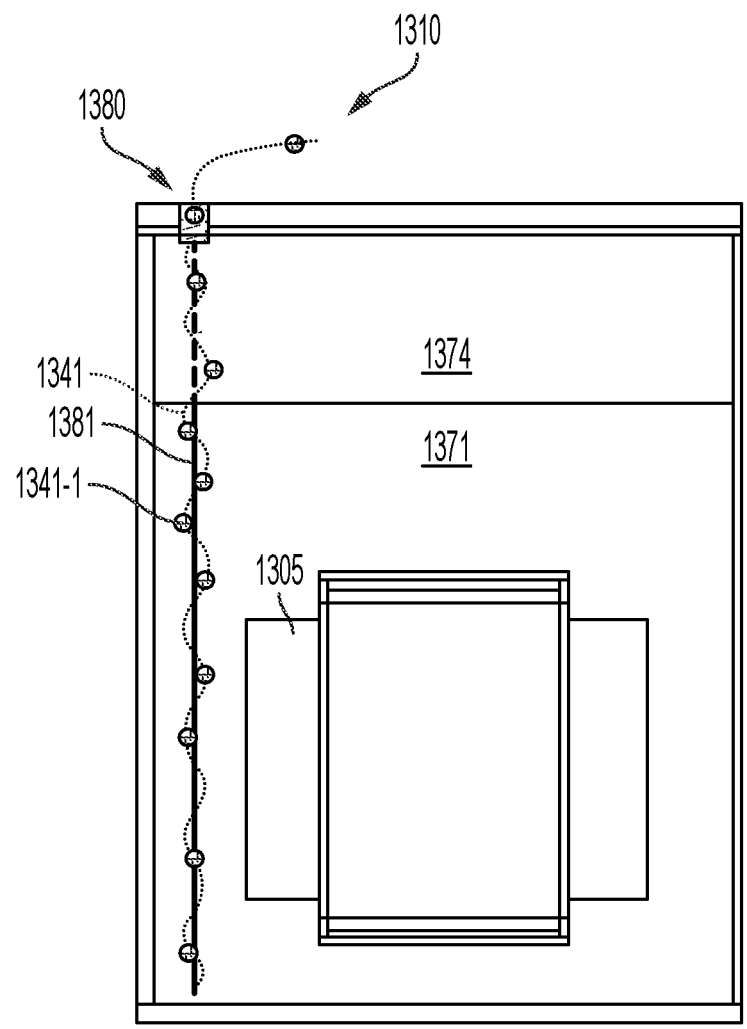

FIGS. 13A and 13B illustrate a sensing rod 1380 that can be installed in a grid electrical asset during manufacturing or inserted as a retro-fit for older, existing grid assets such as network transformers or voltage regulators. FIGS. 13A and 13B respectively show front and side cross sectional views of a transformer 1310 into which the sensing rod 1380 has been inserted. The sensing rod 1380 includes a support rod 1381 that supports at least one optical fiber 1341 having one or more optical sensors 1341-1-1341-4 disposed thereon. Some of the optical sensors 1341-1, 1341-2 may be positioned outside the transformer case 1370 and others 1341-3, 1341-4 may be positioned within the transformer case 1370. Note that the optical sensors are part of the optical fiber, e.g., FBG sensors, and the sensing dots indicate sensing points on the optical fiber. The optical fiber 1341 may wind around the exterior surface of the support rod 1381 as shown, or may be embedded within the support rod 1381. In some embodiments, the support rod can be a tube and the optical fiber is threaded through the tube.

The support rod 1381 extends into the transformer case 1370 through the head space 1374 and the oil 1371 and possibly extending past the coils 1305, 1306, 1307 and cores 1301-1304 toward the bottom of the case 1370. The rod may extend the majority of the distance through the transformer 1310 in some implementations. The support rod 1381 may rigid or flexible. The support rod 1381 can be made of any suitable material, preferably an electrically insulative material. In some configurations, the support rod 1381 is made of polycarbonate.

The optical sensors 1341-1-1341-4 can be distributed along the support rod 1381 and used to sense temperature, vibration and/or liquid level for example. In this example, the optical sensors 1341-1-1341-4 are not directly mounted to the electrical device or components of the electrical device itself (e.g., tank, core, coil, etc.).

Figure 14:
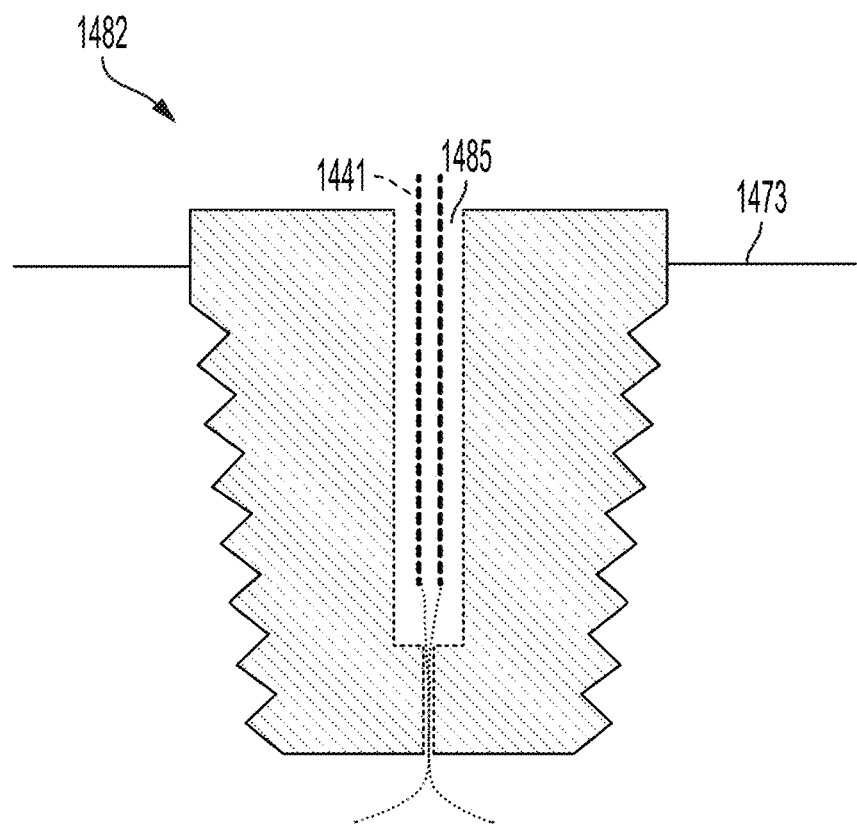
FIG. 14 is a cross sectional diagram of a plug suitable to allow for installation of optical fibers into an electrical asset in accordance with some embodiments.

The sensing rod 1380 can be inserted through a plug 1382 in the electrical device such as a national pipe thread (NPT) or other type of plug. Conveniently, many grid assets have 2", 1" or ½" NPT plugs through which a sensing rod can be inserted into the tank. FIG. 14 is a cross sectional diagram of a plug 1482 suitable to allow for installation of optical fibers into an electrical asset. The plug 1482 could be modified or formed to include a feedthrough 1085 for the optical fibers 1441. After inserting the optical fibers 1441 through the feedthrough 1485 in the plug 1482, the feedthrough 1485 could be hermetically sealed, e.g., using epoxy, around the fibers 1441. Hermetic sealing the optical fibers in the plug is straightforward since the typical diameter of an optical fiber cable is about 100 to 250 micrometers.

The plug 1482 can be inserted into the case lid 1473 before sealing the feedthrough 1485 to avoid twisting the optical fibers during installation of the plug. Alternatively, the feedthrough 1485 could be sealed before installing the plug. Installation could involve counter-rotating the plug 1482 a number of times while holding the portion of the optical fiber to be inserted into the case fixed. The counter-rotation is in a direction opposite of the direction of rotation that installs the plug in the case lid. Subsequent to the counter-rotation, the plug 1482 could be screwed into the case lid 1473. The number of times the plug 1482 is counter-rotated is about equal to the number of rotations needed to install the plug 1482 in the lid 1473.

Figure 15:
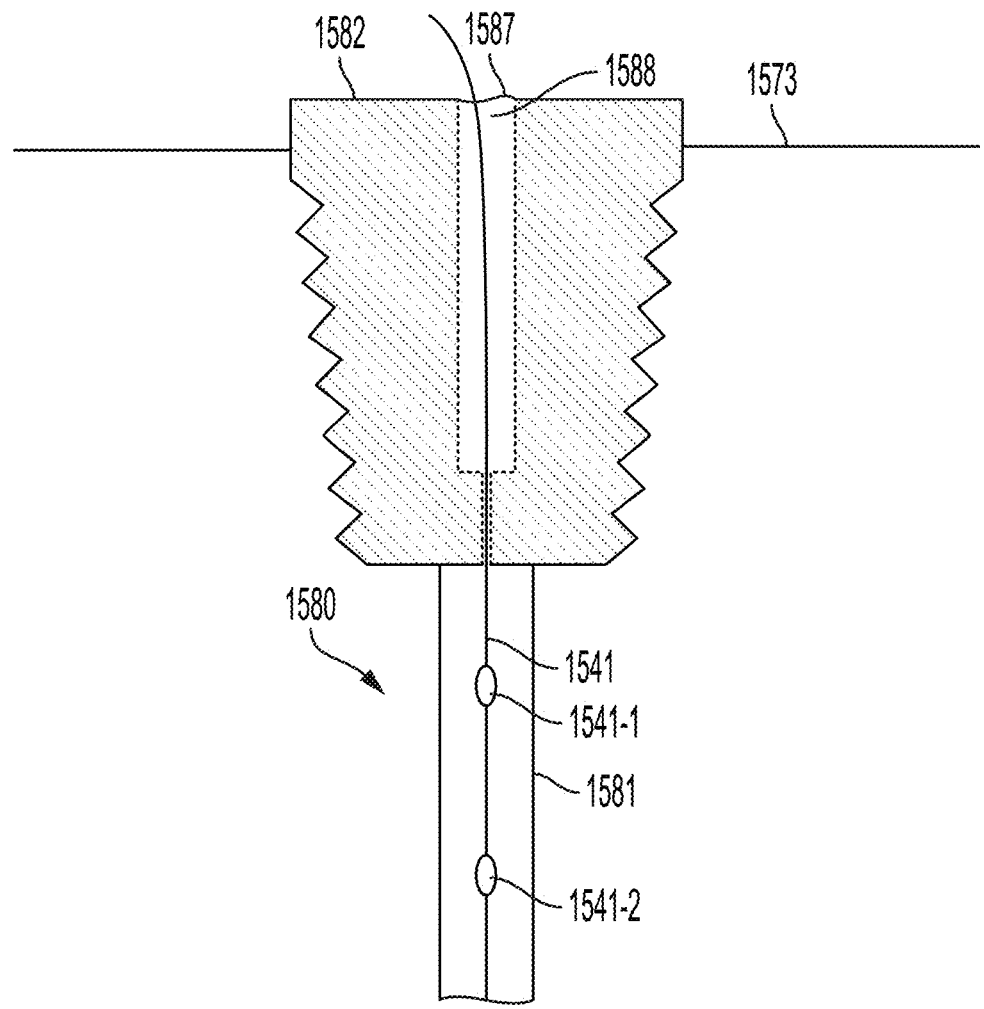
FIG. 15 shows a support rod attached to a plug in accordance with some embodiments.

In some embodiments, the support rod 1581 may be attached to the plug 1582 as illustrated in FIG. 15. The support rod supports at least one optical fiber 1541 having sensors 1541-1, 1541-2 disposed thereon. The optical fiber 1541 is inserted through an opening 1588 in the plug 1582. The plug 1582 is threaded into an opening in the case lid 1573 of the electrical device.

As described above, some particular interesting points for temperature sensing are: temperature outside of the tank (environment), temperature close/at the transformer wall; temperature above the oil level in the headspace, temperature of the oil near the surface, right above the coil, close to the middle of the coil and below the coil close to the bottom of the tank. In this embodiment, vibration sensors cannot mounted directly to the cores, low voltage plate, etc. but they may be mounted to rod at different locations so that they are differently affected by impacts from outside or vibrations generated inside by the different transformer components, e.g., by the (de)magnetization of the core. Depending on the size, dimensions, and material of the support rod, as well as the applied mounting technique, the vibration sensors can reasonably pick up certain frequencies generated by the transformer components or transferred to the transformer from outside.

Figure 16:
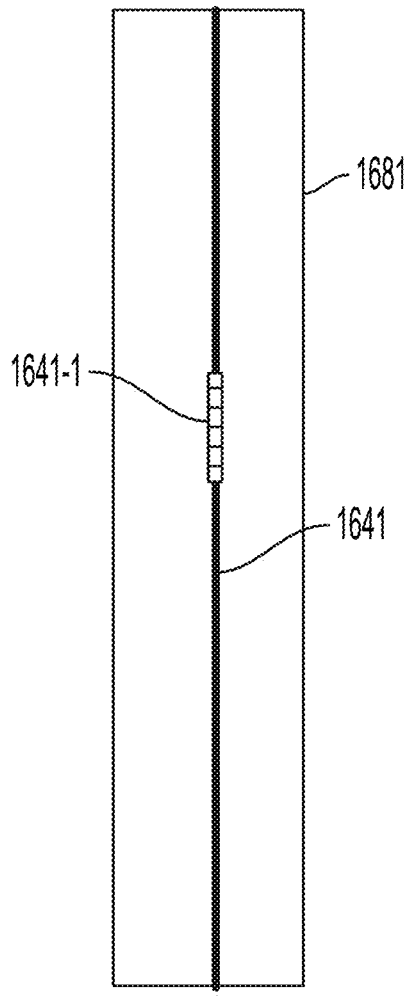
FIG. 16 depicts an optical fiber sensor mounted on a support rod in accordance with some embodiments.
Figure 17:
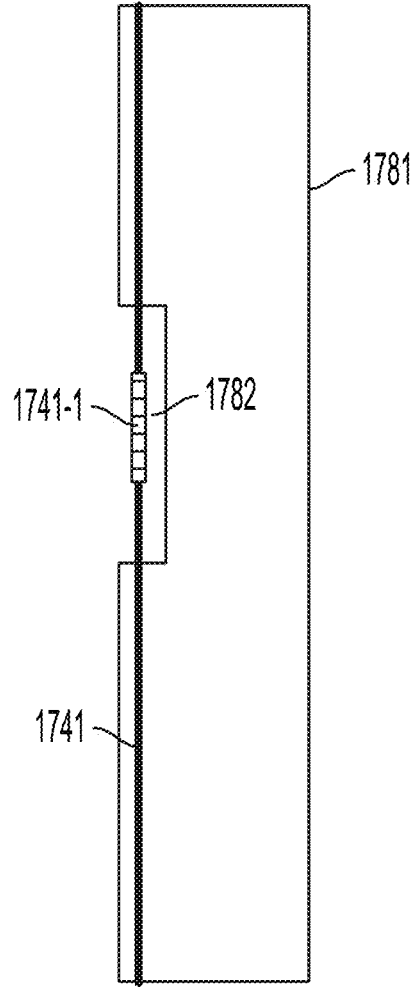
FIG. 17 shows an optical fiber sensor disposed in a notch on a support rod in accordance with some embodiments.

FIGS. 16 and 17 illustrate different configurations for mounting the sensing fiber to the rod. These sensing configurations allow the sensing point to be sensitive to vibrations of the sensing rod or to vibrations from the surrounding oil. As illustrated in FIG. 16, the optical fiber 1641 can be directly glued or mounted to the support rod 1681. In this configurations, the vibration sensors 1641-1 picks up the vibrations transferred from the transformer components or tank to the rod 1681. As shown in FIG. 17, the optical fiber 1741 can also be glued to a notch 1782 in the support rod 1781. In this configuration, the optical sensor 1741-1 is directly exposed to vibrations in the transformer oil itself. A particular tension and/or length of the exposed the fiber can be selected to achieve a desired resonant frequency (similar to a guitar string.)

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A sensor system comprising:
a sensor network comprising at least one optical fiber that includes one or more optical sensors, the optical sensors arranged to sense vibration of an electrical device and to produce a time varying light output in response to the vibration;
at least one detector configured to generate an electrical time domain signal in response to the time varying light output of at least one optical sensor of the sensor network; and
an analyzer configured to:
acquire at least one snapshot frequency component signal comprising one or more time varying signals of frequency components of the time domain signal over a data acquisition time period; and
detect a condition of the electrical device based on the snapshot frequency component signal;
wherein the electrical device is electrically connected to a power grid, and the snapshot frequency component signal includes a frequency of the power grid and one or more harmonics thereof.

2. The sensor system of claim 1, wherein the analyzer is further configured to:
compare at least one snapshot frequency component signal to a known frequency component template corresponding to a condition of the electrical device; and
detect the presence or amount of the condition based on the comparison.

3. The system of claim 1, wherein the analyzer is configured to perform a time-frequency transformation of the time domain signal.

4. The system of claim 1, wherein the analyzer is configured to detect the condition based on amplitudes or amplitude ratios of frequency components of the snapshot frequency component signal.

5. The system of claim 1, wherein the analyzer is configured to:
develop a trend of changes in the snapshot frequency component signal over time; and
detect a change in the condition based on the trend.

6. A method comprising:
optically sensing vibration of an electrical device and producing a time variation in light output from at least one optical sensor in response to the vibration;
generating an electrical time domain vibration signal representing the time variation in light output;
acquiring at least one snapshot frequency component signal comprising one or more time varying frequency components of the time domain signal over a data acquisition time period; and
detecting a condition of the electrical device based on the snapshot frequency component signal;
wherein the electrical device is electrically connected to a power grid, and the snapshot frequency component signal includes a frequency of the power grid and one or more harmonics thereof.

7. A sensor system comprising:
a sensor network comprising at least one optical fiber including one or more optical sensors, the optical sensors arranged to sense one or more parameters of an electrical device;
at least one detector configured to generate an electrical time domain signal in response to a time variation in light output of at least one optical sensor of the sensor network;
an analyzer configured to:
identify changes in a first parameter of the electrical device based on analysis of the time domain signal of the optical sensor over a first data acquisition period; and
identify changes in a second parameter of the electrical device based on analysis of the time domain signal of the optical sensor over a second data acquisition period that is shorter than the first data acquisition period;
wherein the analyzer is configured to develop a correlation between two or more different sensed parameter signals and detect a change in the presence or amount of the condition based on a change in the correlation.

8. The system of claim 7, wherein the first parameter is internal temperature of the electrical device and the second parameter is vibration of the electrical device.

9. The system of claim 7, wherein the first parameter is ambient temperature external and proximate to the electrical device and the second parameter is vibration of the electrical device.

10. The system of claim 7, wherein:
the at least one optical sensor comprises multiple optical sensors;
the detector is configured to respectively detect multiple time domain signals of the multiple optical sensors over the first data acquisition period or the second data acquisition period; and
the analyzer is configured to identify a parameter distribution within the electrical device based on analysis of the multiple time domain signals over the first data acquisition period or the second data acquisition period.

11. The system of claim 10, wherein the parameter distribution is a temperature distribution.

12. The system of claim 7, wherein the analyzer is configured to:
develop a correlation between vibration signals at different sensing points; and
detect a change in the presence or amount of the condition based on a change in the correlation.

13. The method of claim 7, wherein the two or more different sensed parameter signals include a vibration signal and a temperature signal.

14. A sensor system comprising:
a sensor network comprising at least one optical fiber including one or more optical sensors, the optical sensors arranged to sense one or more parameters of an electrical device;
at least one detector configured to generate an electrical time domain signal in response to a time variation in light output of at least one optical sensor of the sensor network;
an analyzer configured to:
identify changes in a first parameter of the electrical device based on analysis of the time domain signal of the optical sensor over a first data acquisition period; and
identify changes in a second parameter of the electrical device based on analysis of the time domain signal of the optical sensor over a second data acquisition period that is shorter than the first data acquisition period;

wherein the analyzer is configured to develop a correlation between vibration signals at different sensing points and detect a change in the presence or amount of the condition based on a change in the correlation.

* * * * *